(12) United States Patent
Abdel-Hafez et al.

(10) Patent No.: US 7,058,869 B2
(45) Date of Patent: Jun. 6, 2006

(54) METHOD AND APPARATUS FOR DEBUG, DIAGNOSIS, AND YIELD IMPROVEMENT OF SCAN-BASED INTEGRATED CIRCUITS

(75) Inventors: Khader S. Abdel-Hafez, San Franciso, CA (US); Xiaoqing Wen, Sunnyvale, CA (US); Laung-Terng Wang, Sunnyvale, CA (US); Po-Ching Hsu, Hsinchu (TW); Shih-Chia Kao, Taipei (TW); Hao-Jan Chao, Taoyuan (TW); Hsin-Po Wang, Hsinchu (TW)

(73) Assignee: Syntest Technologies, Inc., Sunnyvale, CA (US)

( * ) Notice: Subject to any disclaimer, the term of this patent is extended or adjusted under 35 U.S.C. 154(b) by 199 days.

(21) Appl. No.: 10/762,571

(22) Filed: Jan. 23, 2004

(65) Prior Publication Data
US 2004/0237015 A1    Nov. 25, 2004

Related U.S. Application Data

(60) Provisional application No. 60/442,901, filed on Jan. 28, 2003.

(51) Int. Cl.
*G01R 31/3177* (2006.01)
*G01R 31/3181* (2006.01)
*G01R 31/3185* (2006.01)

(52) U.S. Cl. .................. 714/729; 714/726; 714/727
(58) Field of Classification Search ............. 714/727, 714/729
See application file for complete search history.

(56) References Cited

U.S. PATENT DOCUMENTS 6,543,018 B1 * 4/2003 Adusumilli et al. ........ 714/729

| | | | | |
|---|---|---|---|---|
| 6,557,129 | B1 * | 4/2003 | Rajski et al. | 714/729 |
| 6,901,546 | B1 * | 5/2005 | Chu et al. | 714/729 |
| 2002/0120896 | A1 * | 8/2002 | Wang et al. | 714/731 |
| 2002/0188903 | A1 | 12/2002 | Chu et al. | 714/738 |
| 2003/0115521 | A1 | 6/2003 | Rajski et al. | 714/724 |

(Continued)

FOREIGN PATENT DOCUMENTS

JP    2002122639 A  *  4/2002

(Continued)

OTHER PUBLICATIONS

Huang, Y. et al.; Statistical Diagnosis for Intermittent Scan Chain Hold-Time Fault; ITC International Test Conference Paper 12.2; 2003; pp. 319-328.*

(Continued)

*Primary Examiner*—R. Stephen Dildine
(74) *Attorney, Agent, or Firm*—Jim Zegeer

(57) ABSTRACT

A method and apparatus for debug, diagnosis, and/or yield improvement of a scan-based integrated circuit where scan chains embedded in a scan core 303 have no external access, such as the case when they are surrounded by pattern generators 302 and pattern compactors 305, using a DFT (design-for-test) technology such as Logic BIST (built-in self-test) or Compressed Scan. This invention includes an output-mask controller 301 and an output-mask network 304 to allow designers to mask off selected scan cells 311 from being compacted in a selected pattern compactor 305. This invention also includes an input chain-mask controller and an input-mask network for driving constant logic values into scan chain inputs of selected scan chains to allow designers to recover from scan chain hold time violations. Computer-aided design (CAD) methods are then proposed to automatically synthesize the output-mask controller 301, output-mask network 304, input chain-mask controller and input-mask network, and to further generate test patterns according to the synthesized scan-based integrated circuit.

34 Claims, 30 Drawing Sheets

U.S. PATENT DOCUMENTS

2003/0154433 A1* 8/2003 Wang et al. ................ 714/726
2004/0230884 A1* 11/2004 Rajski et al. ............... 714/742

FOREIGN PATENT DOCUMENTS

WO    WO 2005031378 A1 * 4/2005

OTHER PUBLICATIONS

Liu, C. et al.; A Partition-Based Approach for Identifying Failing Scan Cells in Scan-BIST☐☐with Applications to System-on-Chip Fault Diagnosis; Proceedings of the Design,Automation and Test in Europe Conference and Exhibition; 2003; 6 unnumbered pages.*

Ghosh-Dastidar et al, "A Rapid and Scalable Diagnosis Scheme for BIST Environments with a Large Number of Scan Chains", Proc., IEEE VLSI Test Symposium (VTS), pp. 79-85, 2000.

* cited by examiner

Prior-Art #1

Prior-Art #2

Prior-Art #3

US 7,058,869 B2

METHOD AND APPARATUS FOR DEBUG, DIAGNOSIS, AND YIELD IMPROVEMENT OF SCAN-BASED INTEGRATED CIRCUITS

RELATED APPLICATION DATA

This application claims the benefit of U.S. Provisional Application No. 60/442,901 filed Jan. 28, 2003, titled "Method and Apparatus for Debug/Diagnosis and Yield Improvement for Scan Based Integrated Circuits", which is hereby incorporated by reference.

FIELD OF THE INVENTION

The present invention generally relates to the field of scan-based design and test using design-for-test (DFT) techniques. Specifically, the present invention relates to the field of Scan/ATPG (automatic test pattern generation), Logic BIST (built-in self-test), and Compressed Scan/ATPG.

BACKGROUND OF THE INVENTION

Modern integrated circuits incorporate a variety of design-for-test (DFT) structures to enhance their inherent testability. The most popular DFT structure is based on scan design where a plurality of externally accessible scan chains, each comprising one or more scan cells coupled in series, are embedded into the integrated circuit. The scan cell is a storage element comprising either a scan flip-flop or a scan latch. Typically, scan design is used in conjunction with fault simulation and combinational ATPG (automatic test pattern generation) to generate manufacturing and diagnostic test patterns for production test, prototype debug, and yield improvement.

It is not uncommon for many functionally fault-free manufactured devices to fail the Scan/ATPG test due to errors in scan design implementation. A typical example is when one or more scan chains are incorrectly designed, causing hold time violations to exist between adjacent scan cells during a shift operation. In this case, a significantly large percentage of manufactured devices are likely to fail the flush-test portion of the Scan/ATPG test. Another example is when a scan design implementation introduces a hold time violation at the data input of a scan cell that does not exist in normal operation mode, and that is exercised during a capture operation. This causes the scan cell to fail the deterministic-test portion of the Scan/ATPG test for a significantly large percentage of the manufactured devices due to an undesirable state, which causes test failures, being captured into the scan cell. These scan design implementation mishaps often further result in a degradation of manufacturing yield.

Since scan design implementation errors are often only uncovered after the devices are manufactured, it is desirable to be able to recover from such scan design implementation errors at a stage when physical design changes are no longer possible. In a conventional Scan/ATPG approach, manufacturing yield is recovered by instructing an automatic test equipment (ATE) either to ignore comparison errors of all undesirable states in failing scan cells which are determined to be due to incorrect scan design implementation, or to completely ignore comparing all failing scan chains that are determined to be incorrectly designed.

With the emerging popularity of design-for-test (DFT) methodologies, such as Logic BIST (built-in self-test) and Compressed Scan/ATPG, scan chains are no longer externally accessible during the test process. In these schemes, a large number of scan chains are implemented in a design such that their scan chain inputs are controlled by a pattern generator, such as a pseudorandom pattern generator (PRPG), a random pattern generator (RPG), a broadcaster, or a decompressor, and such that their scan chain outputs are connected to a pattern compactor, such as a multiple-input signature-register (MISR) or a linear compactor. Utilizing these pattern generators and pattern compactors during test limits the amount of scan chain debug and diagnosis that is possible, and reduces or eliminates the ability to improve yield by selectively masking off failing scan cells on an ATE. This makes it extremely difficult to recover from any inadvertent scan design implementation errors. This can have a dramatic effect on manufacturing yield and can force a designer to abandon the selected DFT methodology.

Prior-art solutions to this problem tend to focus on the debug and diagnosis aspects rather than on yield improvement. These solutions manage the interactions between scan chains and scan cell locations to be masked off using a combinational logic network that is built out of a network of AND gates. This forces the interaction between scan chain masking and scan cell location masking to be cumulative, meaning that the masking off is the union of the two. Three prior-art solutions are summarized below:

Prior-art #1, FIG. 2A, is described in a paper co-authored by Ghosh-Dastidar and Touba (2000). This solution adds an output-mask network $206a$, built out of a network of AND gates, between the scan core (scan chain) outputs and the inputs of the pattern compactor $207a$, called MISR. A combinational output controller is used in conjunction with a shift register $202a$ and a range comparator $201a$ to control which scan chains and scan cell locations across all scan chains should be prevented from reaching the MISR. A scan cell location across all scan chains includes all scan cells, one from each scan chain, that appear at the scan outputs during the same cycle of the shift-out operation and are compacted in parallel into the pattern compactor. This solution suffers from two major limitations. The first limitation is due to the fact that a range comparator $201a$ is used to specify the range of scan cell locations to be masked off. This limits the amount of flexibility this solution can offer in masking off multiple scan cell locations, forcing the user to mask off all fault-free scan cell locations in between. The second limitation is due to the fact that it is necessary to mask off a complete scan chain or a complete scan cell location across all scan chains in order to improve yield for a single bit failure. This dramatically reduces the circuit's fault coverage. The limitation becomes extremely severe, further reducing the circuit's fault coverage, when multiple bit failures are spread across multiple scan chains in various scan cell locations.

Prior-art #2, FIG. 2B, is described in U.S. Patent Application Publication US 2002/0188903 A1 by Chu et al. (2002). This solution replaces the range comparator with a ring counter $201b$ shifting alongside the regular scan chains, allowing individual scan cell locations across all scan chains to be masked off. However, this solution does not adequately solve the problem of being able to improve yield with minimum fault coverage loss, since it is still required to mask off a complete scan chain or a complete scan cell location across all scan chains in order to mask off a single bit failure. Similar limitations as prior-art solution #1 also exist for multiple bit failures.

Prior-art #3, FIG. 2C, is described in U.S. Patent Application Publication US 2003/0115521 A1 by Rajski et al. (2003). This solution utilizes a selector circuit $204c$ similar to the output-mask network in prior-art solution #1, and a controller circuit 203c broadly defined to include any circuit capable of preventing failing scan cells from reaching the pattern compactor (MISR). Its purpose is mainly to mask off unknown states and multiple faults from reaching the MISR during test, debug, or diagnosis, and not for yield improvement. In all the embodiments specified by this invention, the circuitry used for masking off interactions between scan chains and scan cell locations is always implemented using a network of AND gates, similar to the combinational output controller of the previous two prior-art solutions. Thus, this solution still suffers from the problem of having to mask off a complete scan chain or a complete scan cell location across all scan chains in order to be able to mask off multiple bit failures.

Therefore, there is a need to extend the debug and diagnosis capabilities of current prior-art solutions to cover yield improvement. There is a further need to extend the debug and diagnosis of the deterministic-test portion of current prior-art solutions to cover the flush-test portion as well. Finally, there is a further need to improve upon current prior-art solutions to allow designers to recover from inadvertent scan design implementation errors, producing a manufacturing test with minimum fault coverage loss.

SUMMARY OF THE INVENTION

Accordingly, a primary objective of the present invention is to provide an improved method and apparatus for debug, diagnosis, and yield improvement of a scan-based integrated circuit, incorporating a design-for-test (DFT) methodology where scan chains are no longer externally accessible. In order to achieve this objective, the present invention comprises a method and apparatus of using an output-mask controller and an output-mask network to mask off undesirable states, which cause test failures, from reaching a pattern compactor. The output-mask controller includes a combinational output controller, capable of implementing any combinational logic function other than a complete network of AND gates. The present invention further comprises a method and apparatus of using an input chain-mask controller and an input-mask network to allow designers to recover from faulty scan chain design by forcing constant logic values to the scan chain inputs of failing scan chains during test.

The following inventions are used to perform debug, diagnosis, and yield improvement of a scan-based integrated circuit.

Output-Mask Controller

In the present invention, an output-mask controller, comprising a sequential output controller and a combinational output controller, is used to generate a number of output-mask enable signals for controlling an output-mask network in order to mask off undesirable states. The output-mask controller can further comprise a load signal, used to preset the output-mask controller with a predetermined state for selectively masking off failing scan cells. It can further comprise an initialize signal, used to reset the sequential output controller or to bypass the combinational output controller for preventing the output-mask enable signals from masking off any scan cells.

In contrast to prior-art solutions employing a cell-mask controller and a chain-mask controller, the present invention includes a sequential output controller comprising any number of cell-mask controllers, chain-mask controllers, and pattern-mask controllers for generating cell-mask signals, chain-mask signals, and pattern-mask signals, respectively. These signals are collectively referred to as sequential-mask signals.

Cell-mask controllers specify the pass/mask information for all scan cell locations across all scan chains. A cell-mask controller can be any finite-state machine, such as a ring counter or a range comparator.

Chain-mask controllers specify the pass/mask information for all scan chains. A chain-mask controller can be any finite-state machine, such as a shift register or a range decoder.

Pattern-mask controllers specify the pass/mask information for all scan patterns. A pattern-mask controller can be used to indicate which scan patterns to mask off completely, and which scan patterns to mask off according to the cell-mask signals and chain-mask signals. A pattern-mask controller can be any finite-state machine, such as a shift register or a range comparator.

A distinguishing feature of the present invention is the use of a combinational output controller consisting of one or more combinational logic networks other than a complete network of AND gates. This allows the combinational output controller to mask off undesirable states efficiently, improving yield with minimum fault coverage loss. This is done by accepting sequential-mask signals and generating output-mask enable signals, used to control an output-mask network placed in between scan chain outputs and pattern compactors inputs. The following example illustrates how an output-mask controller can be used to perform yield improvement of a scan-based integrated circuit with minimal fault coverage loss by utilizing the combinational output controller proposed in the present invention.

In this example, FIG. 3A, the sequential output controller 306 in the output-mask controller 301 is implemented using a cell-mask controller and a chain-mask controller. The combinational output controller 307 in the output-mask controller 301 is implemented using a network of OR gates, FIG. 7B. Each OR gate is controlled by a cell-mask signal 706b for the current scan cell location and a chain-mask signal 708b to 711b for each individual scan chain.

In order to debug or diagnose each scan chain individually, the cell-mask controller 308 is programmed to generate a cell-mask signal 319 with logic value 0 for all scan cell locations, and the chain-mask controller 309 is programmed to generate a chain-mask signal 320 with logic value 1 only for the scan chain to be debugged or diagnosed. Similarly, in order to debug or diagnose each scan cell location across all scan chains individually, the chain-mask controller 309 is programmed to generate a chain-mask signal 320 with logic value 0 for all scan chains, and the cell-mask controller 308 is programmed to generate a cell-mask signal 319 with logic value 1 only for the scan cell location to be debugged or diagnosed.

Finally, in order to improve yield by masking off an undesirable state in a failing scan cell, a cell-mask signal 319 with logic value 0 is generated only for the scan cell location where the failing scan cell resides, and a chain-mask signal 320 with logic value 0 is generated only for the scan chain where the failing scan cell resides. Since the combinational output controller consists of a network of OR gates, logic value 1 is generated for all scan cells, allowing them to pass, except for the failing scan cell where logic value 0 is generated, masking off the undesirable state. Therefore, using an output-mask controller as proposed in the present invention allows designers to achieve yield improvement with minimal hardware requirements and minimal fault coverage loss.

2. Output-Mask Network

In prior-art solutions, the output-mask network always comprises a network of AND gates. In the present invention, however, the output-mask network comprises any combinational logic gates, including AND gates, OR gates, NAND gates, NOR gates, and multiplexors (MUX). The output-mask network can further comprise combinational logic gates that are not identical for all scan chains. The output-mask controller in the present invention is used to selectively force internally generated or externally supplied constant logic values into the pattern compactors based on the logic values of the output-mask enable signals.

3. Input Chain-Mask Controller

In prior-art solutions, no input chain-mask controller is used for recovering from scan design implementation errors causing failures in the flush-test portion. In the present invention, however, an input chain-mask controller is used for generating a number of input-mask enable signals for controlling an input-mask network to force constant logic values into selected scan chains. The input chain-mask controller comprises a finite-state machine, such as a shift register or a range decoder. The Input chain-mask controller can further comprise a load signal, used to preset the input chain-mask controller with a predetermined state for forcing constant logic values into selected scan chains. It can further comprise an initialize signal, used to reset or bypass the controller for preventing the input-mask enable signals from forcing constant logic values into any scan chains.

The input chain-mask controller allows designers to recover from hold time violations existing between adjacent scan cells by forcing constant logic values into the failing scan chains and using the fault-free subset of the scan chains during test.

4. Input-Mask Network

The present invention further includes an input-mask network which comprises any combinational logic gates, including AND gates, OR gates, NAND gates, NOR gates, and multiplexors (MUX). The input-mask network can further comprise combinational logic gates that are not identical for all scan chains. The input-mask network in the present invention is used to selectively force internally generated or externally supplied constant logic values into selected scan chains based on the logic values of the input-mask enable signals.

In summary, the present invention provides an efficient solution for debug, diagnoses, and yield improvement of a scan-based integrated circuit. This invention includes an output-mask controller and an output-mask network used for masking off undesirable states from reaching pattern compactors. This invention also includes an input chain-mask controller and an input-mask network used for forcing constant logic values into scan chains containing hold time violations existing between adjacent scan cells. Using the circuitry of this invention, it is possible to dynamically mask off undesirable states in failing scan cells and to dynamically force constant logic values into all scan cells of failing scan chains in order to use the fault-free subset of the scan chains during test. This allows designers to recover from scan design implementation errors at a stage when physical design changes are no longer possible and to create a manufacturing test with minimum fault coverage loss for the purposes of debug, diagnosis, and yield improvement.

THE BRIEF DESCRIPTION OF DRAWINGS

The above and other objects, advantages and features of the invention will become more apparent when considered with the following specification and accompanying drawings wherein.

Figure 14A:
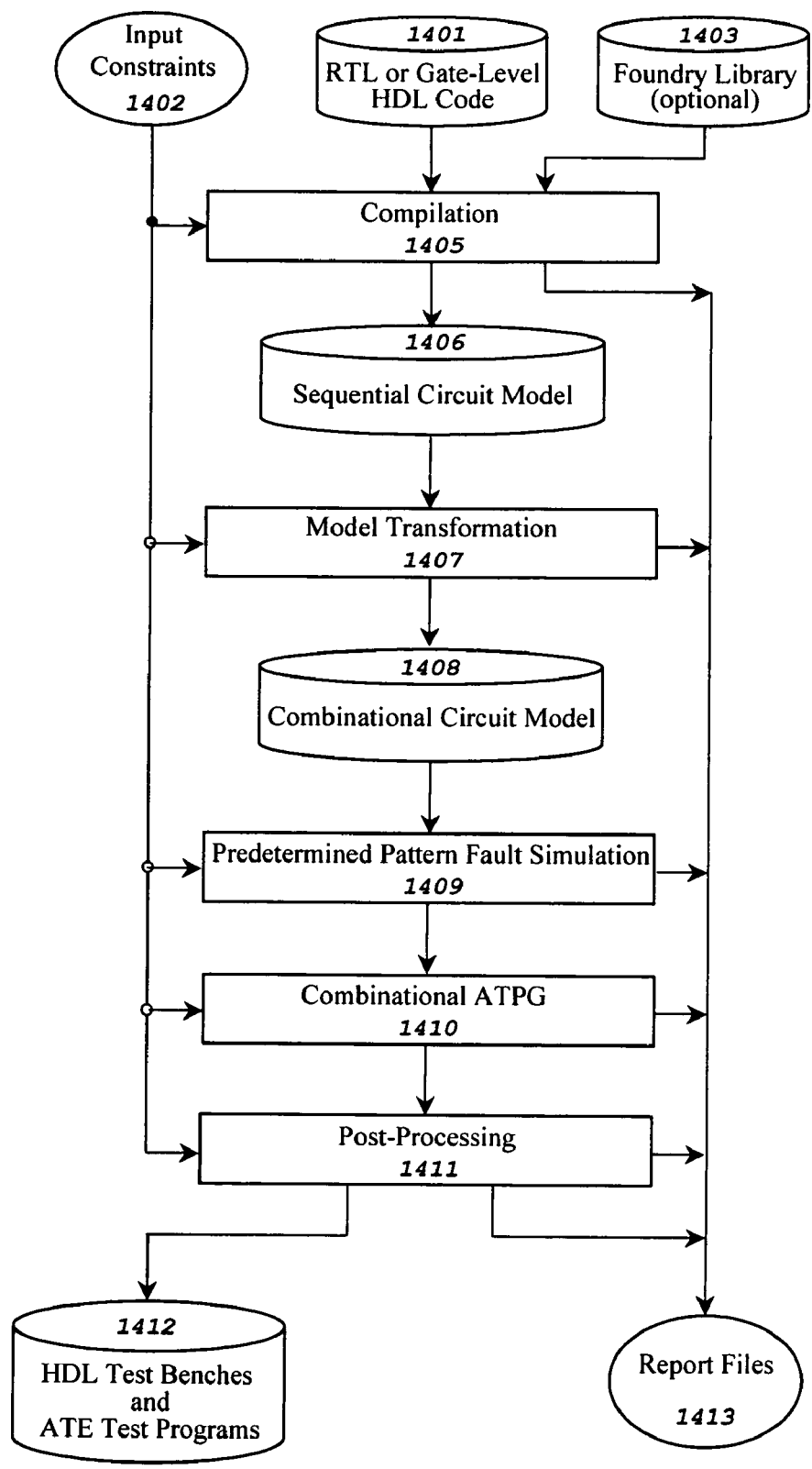
FIG. 14A shows a flow diagram of the method for generating test patterns for a scan-based integrated circuit with an output-mask controller, an output-mask network, an input chain-mask controller, and an input-mask network in scan-test mode, in accordance with the present invention.
Figure 14B:
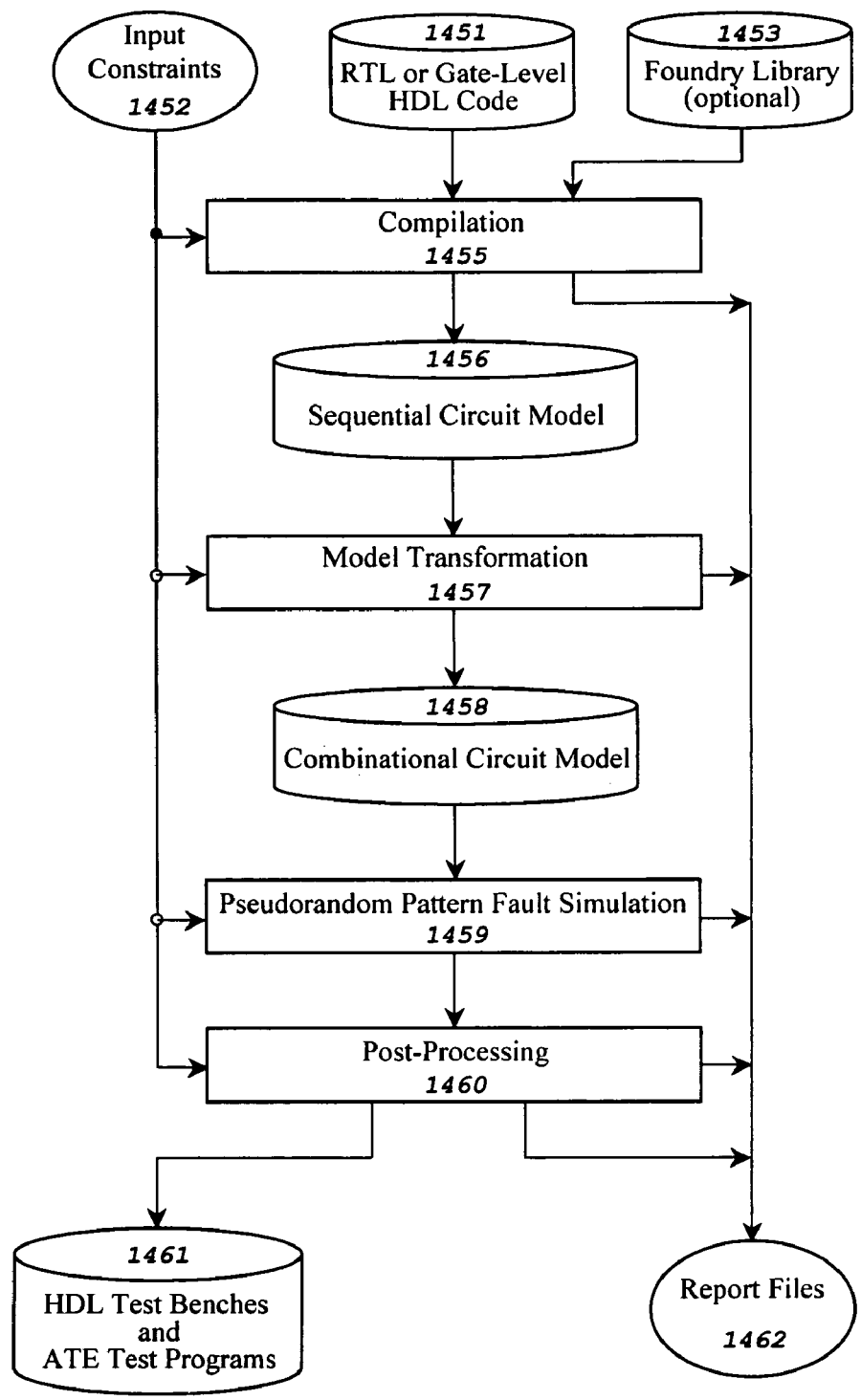
Figure 15:
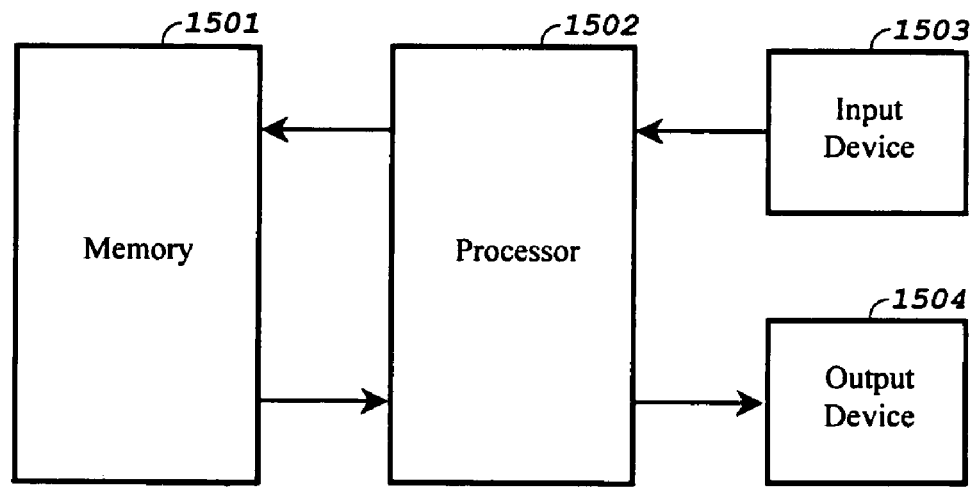

FIG. 14B shows a flow diagram of the method for generating test patterns for a scan-based integrated circuit with an output-mask controller, an output-mask network, an input chain-mask controller, and an input-mask network in self-test mode, in accordance with the present invention; and FIG. 15 shows an electronic design automation system, where a computer-readable program, in accordance with the present invention, performs a method for synthesizing an output-mask controller, an output-mask network, an input chain-mask controller, and an input-mask network, as well as for generating test patterns in either scan-test or self-test mode.

DETAILED DESCRIPTION OF THE DRAWINGS

The following description is presently contemplated as the best mode of carrying out the present invention. This description is not to be taken in a limiting sense but is made merely for the purpose of describing the principles of the invention. The scope of the invention should be determined by referring to the appended claims.

Figure 1A:
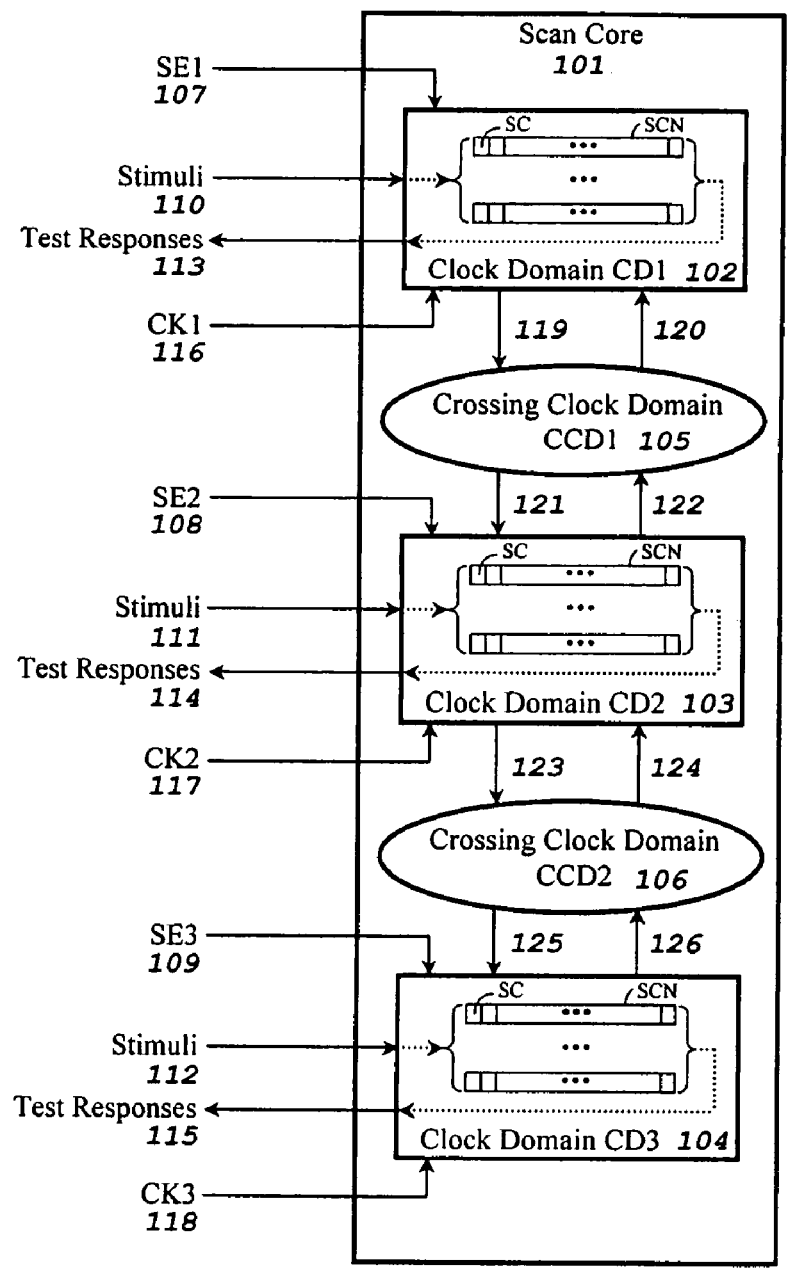
FIG. 1A shows an example of a scan-based integrated circuit.

FIG. 1A shows an example of a scan-based integrated circuit. In the following, a scan-based integrated circuit is also called a scan core, and these two terms are used interchangeably.

The scan core 101 has three clock domains, CD1 102 to CD3 104, and three clocks, CK1 116 to CK3 118. Each clock controls one clock domain. Furthermore, clock domains CD1 102 and CD2 103 interact with each other through the crossing clock-domain logic block CCD1 105; while clock domains CD2 103 and CD3 104 interact with each other through the crossing clock-domain logic block CCD2 106. In addition, all or part of the storage elements in the scan core 101 are replaced with scan cells SC and all scan cells SC are connected into one or more scan chains SCN.

The scan core 101, as any scan-based integrated circuit, is tested by repeating the following operations: First, during a shift-in operation, a stimulus is shifted from 110 to 112 into all scan cells SC through all scan chains SCN within the three clock domains CD1 102 to CD3 104 simultaneously. After the shift-in operation is completed, functional clocks are applied to all or part of the three clock domains to capture a test response into scan cells SC during a capture operation. After the capture operation is completed, the test response captured by all scan cells SC are shifted out from 113 to 115 through scan chains SCN during a shift-out operation in which a new stimulus is also shifted into all scan cells SC simultaneously. Note that all scan cells SC can operate in two modes: either as one or more shift registers or as individual functional storage elements. The mode selection is conducted by scan enable (SE) signals SE1 107 to SE3 109.

Note that a stimulus can be provided, and a test response can be collected, in various manners. Traditionally, a direct-access scheme is often used, in which a stimulus is provided directly to all scan chains and a test response is collected directly from all scan chains. That is, all scan chains are directly accessible from the outside of a scan-based integrated circuit in this scheme. Its advantage is the simplicity of conducting debug, diagnosis, and yield improvement. Its disadvantage, however, is that the number of scan chains is limited. This often results in longer scan chains, which leads to higher test cost.

Figure 1B:
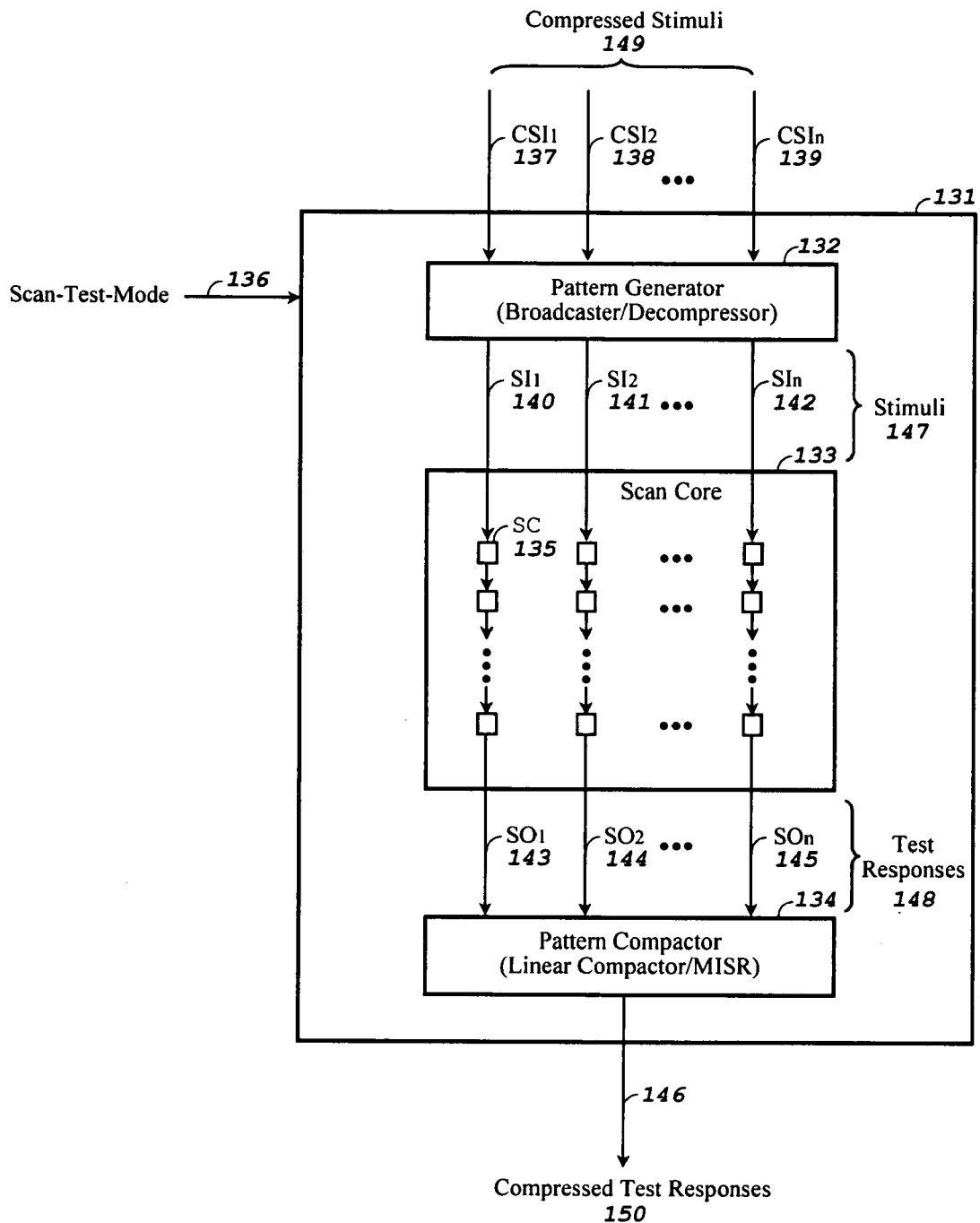
FIG. 1B shows an example of testing a scan-based integrated circuit using Compressed Scan in scan-test mode.

FIG. 1B shows an example of testing a scan-based integrated circuit using Compressed Scan in scan-test mode. The circuit 131 contains a scan core 133 with scan cells SC organized into one or more scan chains. The stimuli 147 are generated from the Pattern Generator 132 by decompressing compressed stimuli 149, which are either generated internally or supplied externally from an ATE (automatic test equipment). The Pattern Generator 132 can be a broadcaster or a decompressor. The test responses 148 are processed by the Pattern Compactor 134 to form compressed test responses 150. The Pattern Compactor 134 can be a linear compactor or a MISR (Multi-Input Signature Register). The Scan-Test-Mode signal 136 is used to configure the integrated circuit 131 such that the scan core 133 can be tested by Compressed Scan in scan-test mode.

Note that there is no limitation on the number of scan chains in a scan core if the scan core is tested using Compressed Scan. The reason is that stimuli are provided, and test responses are collected, completely within the circuit containing the scan core. As a result, a large number of shorter scan chains can be used. This leads to shorter test application time, which results in lower test costs.

The disadvantage of using conventional Compressed Scan is the difficulty of conducting debug, diagnosis, and yield improvement. The reason is that scan chains are no longer externally accessible. The present invention is intended to provide a solution to this problem.

Figure 1C:
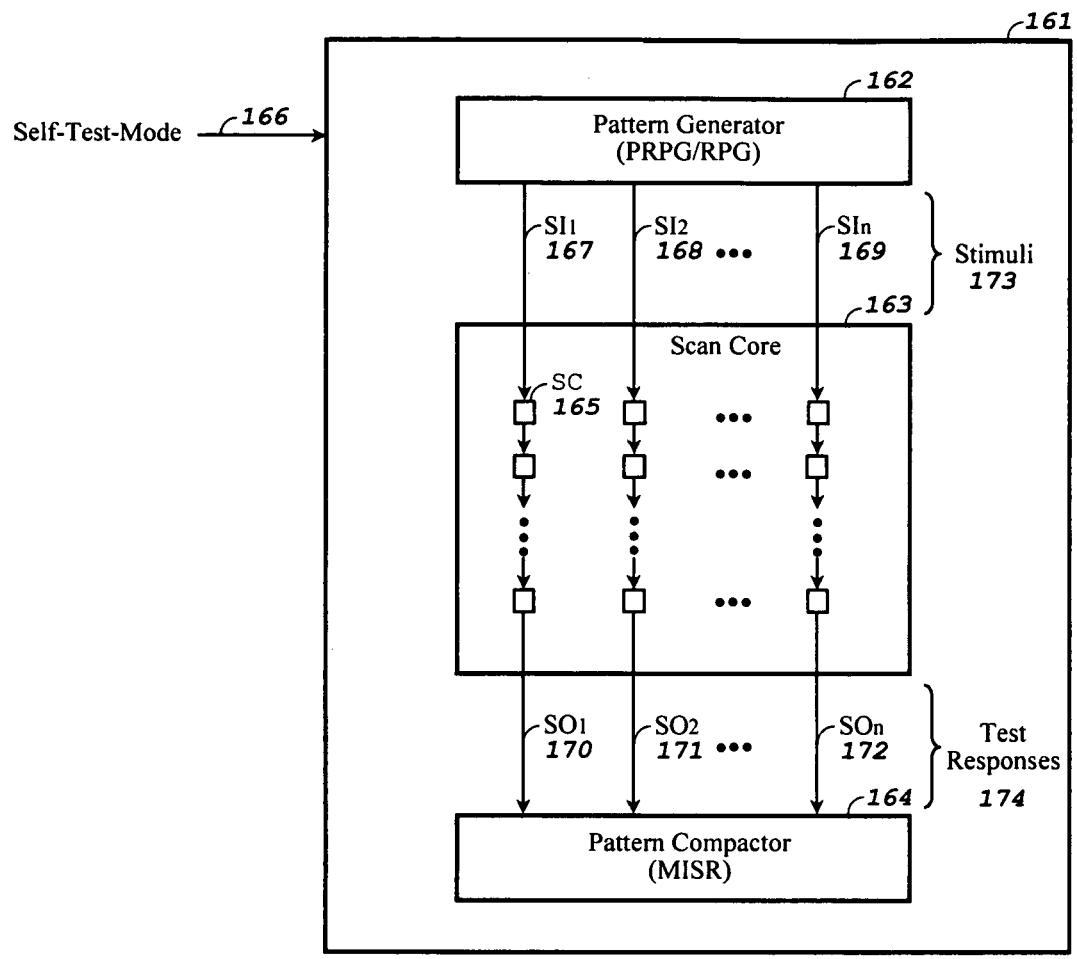
FIG. 1C shows an example of testing a scan-based integrated circuit using Logic BIST (Built-In Self-Test) in self-test mode.

FIG. 1C shows an example of testing a scan-based integrated circuit using Logic BIST (Built-In Self-Test) in self-test mode. The circuit 161 contains a scan core 163 with scan cells SC organized into one or more scan chains. The stimuli 173 are provided from the Pattern Generator 162, which is either a PRPG (Pseudorandom Pattern Generator) or a RPG (Random Pattern Generator). The test responses 174 are compacted into the Pattern Compactor 164, which is a MISR (Multi-Input Signature Register). The Self-Test- Mode signal 166 is used to configure the integrated circuit 161 such that the scan core 163 can be tested by Logic BIST in self-test mode.

Note that there is no limitation on the number of scan chains in a scan core if the scan core is tested using Logic BIST. The reason is that stimuli are provided, and test responses are collected, completely within the circuit containing the scan core. As a result, a large number of shorter scan chains can be used. This leads to shorter test application time, which results in lower test costs.

The disadvantage of using conventional Logic BIST is the difficulty of conducting debug, diagnosis, and yield improvement. The reason is that scan chains are no longer externally accessible. The present invention is intended to provide a solution to this problem.

Figure 2A:
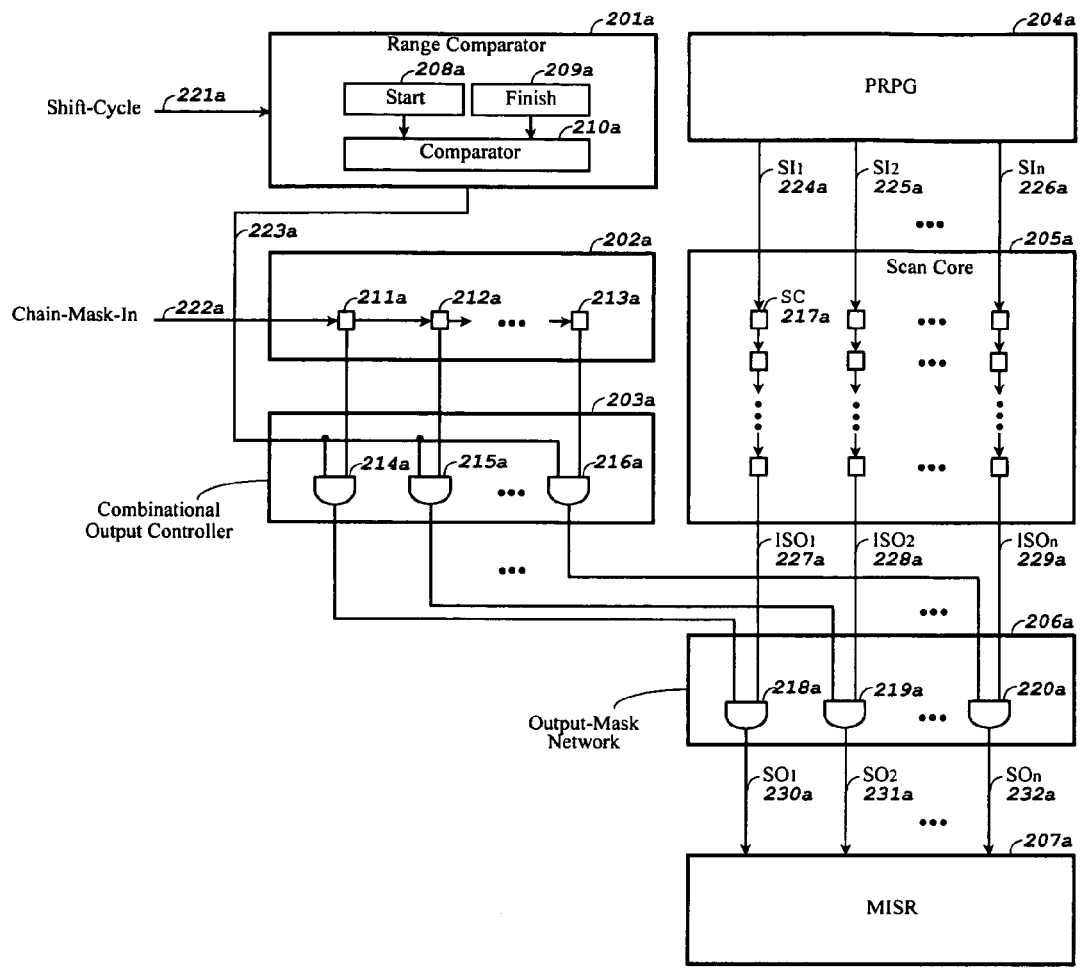
FIG. 2A shows a first prior-art scheme for debug, diagnosis, and yield improvement of a scan-based integrated circuit.

FIG. 2A shows a first prior-art scheme for debug, diagnosis, and yield improvement of a scan-based integrated circuit. The output-mask network 206a, composed of only AND gates 218a to 220a, is inserted between the scan core 205a and the MISR (Multi-Input Signature Register) 207a. The data loaded into the shift register 202a, composed of storage elements 211a to 213a, is used to specify whether a scan chain should be masked off or not. In addition, the range comparator 201a is used to mask off a range of consecutive scan cell locations across all scan chains. The control data bits from the shift register 202a and the range comparator 201a are combined together using the combinational output controller 203a, composed of only AND gates 214a to 216a, to control the output-mask network 206a.

The disadvantage of this prior-art scheme is that it lacks flexibility. The reason is that this scheme does not allow for non-consecutive scan cell locations across all scan chains, as well as multiple ranges of scan cell locations, to be masked off without masking off the ranges in between. In addition, this scheme can only mask off either a complete scan chain or a complete scan cell location across all scan chains in order to recover from a single bit failure during yield improvement. As a result, the fault coverage loss is large.

Figure 2B:
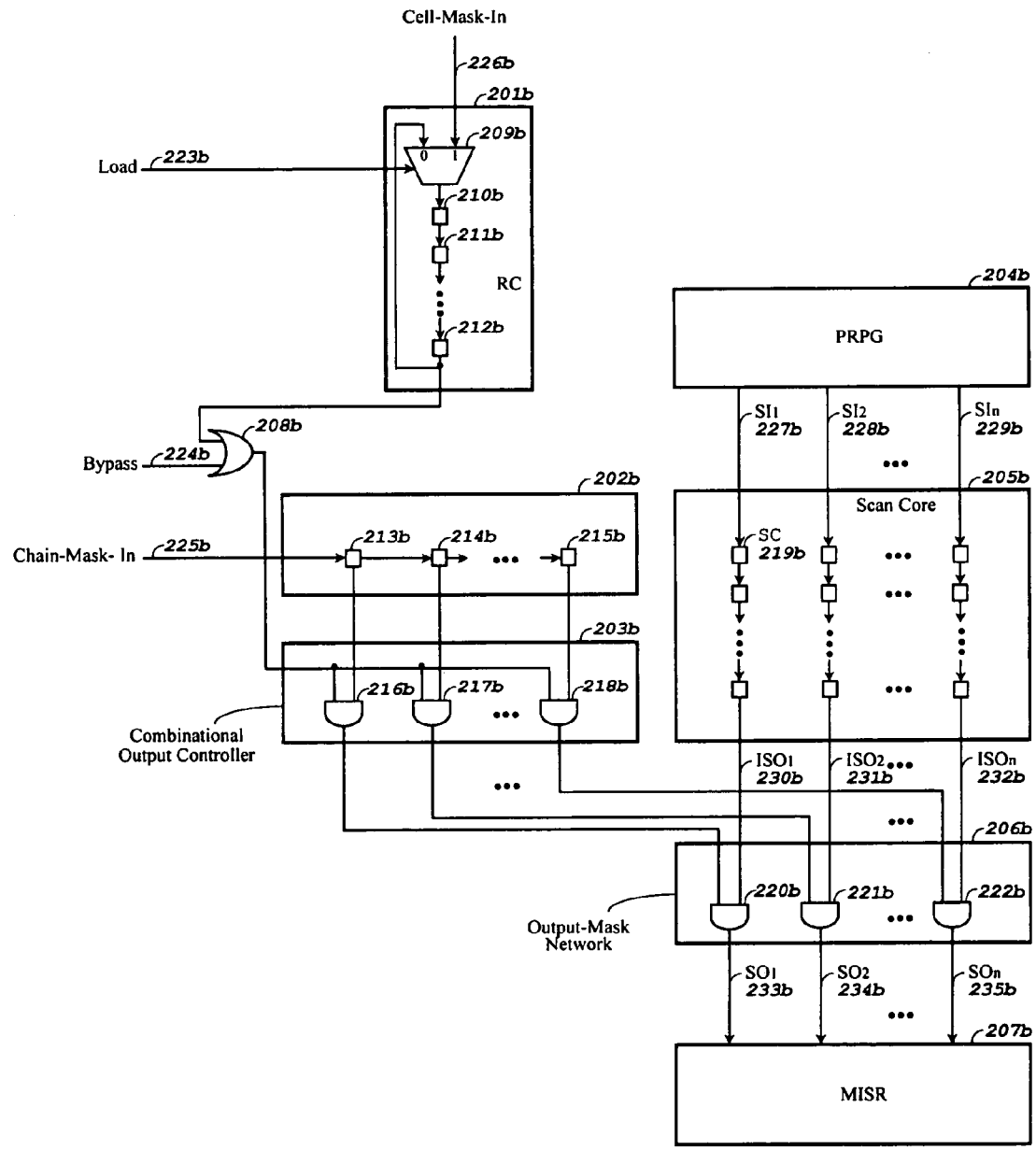
FIG. 2B shows a second prior-art scheme for debug, diagnosis, and yield improvement of a scan-based integrated circuit.

FIG. 2B shows a second prior-art scheme for debug, diagnosis, and yield improvement of a scan-based integrated circuit. The output-mask network 206b, composed of only AND gates 220b to 222b, is inserted between the scan core 205b and the MISR (Multi-Input Signature Register) 207b. The data loaded into the shift register 202b, composed of storage elements 213b to 215b, is used to specify whether a scan chain should be masked off or not. In addition, the ring counter 201b, composed of storage elements 210b to 212b, is used to mask off any combination of scan cell locations across all scan chains. The control data bits from the shift register 202b and the ring counter 201b are combined together using the combinational output controller 203b, composed of only AND gates 216b to 218b, to control the output-mask network 206b This scheme is an improvement over the first prior-art scheme since it allows for individual scan cell locations across all scan chains to be masked off. However, it still requires a complete scan chain or a complete scan cell location across all scan chains to be masked off for a single bit failure. Hence, it does not adequately address the problem of performing yield improvement with minimum fault coverage loss.

Figure 2C:
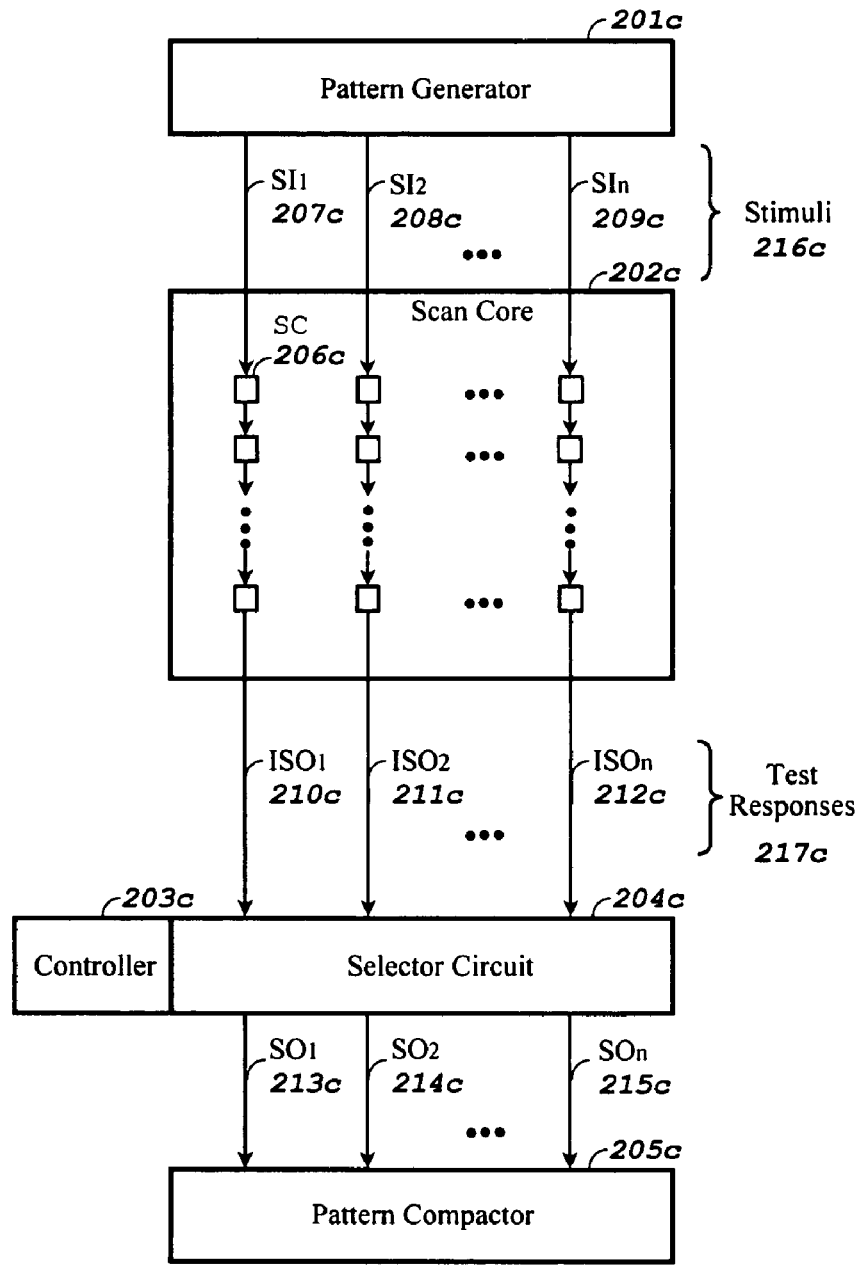
FIG. 2C shows a third prior-art scheme for masking off unknown states and multiple faults of a scan-based integrated circuit.

FIG. 2C shows a third prior-art scheme for masking off unknown states and multiple faults of a scan-based integrated circuit. The selector circuit 204c is inserted between the scan core 202c and the pattern compactor 205c. The selector circuit 204c is controlled by a controller 203c, which implements various functions to block certain output bits for the purpose of masking unknown states and multiple faults.

In all the embodiments specified by the third prior-art solution, masking is always done using a network of AND gates. This is similar to the combinational output controller of the first and the second prior-art solutions, as described in FIG. 2A and FIG. 2B, respectively. As a result, the third prior-art solution also suffers from the problem of not being able to improve yield with minimum fault coverage loss.

Figure 3A:
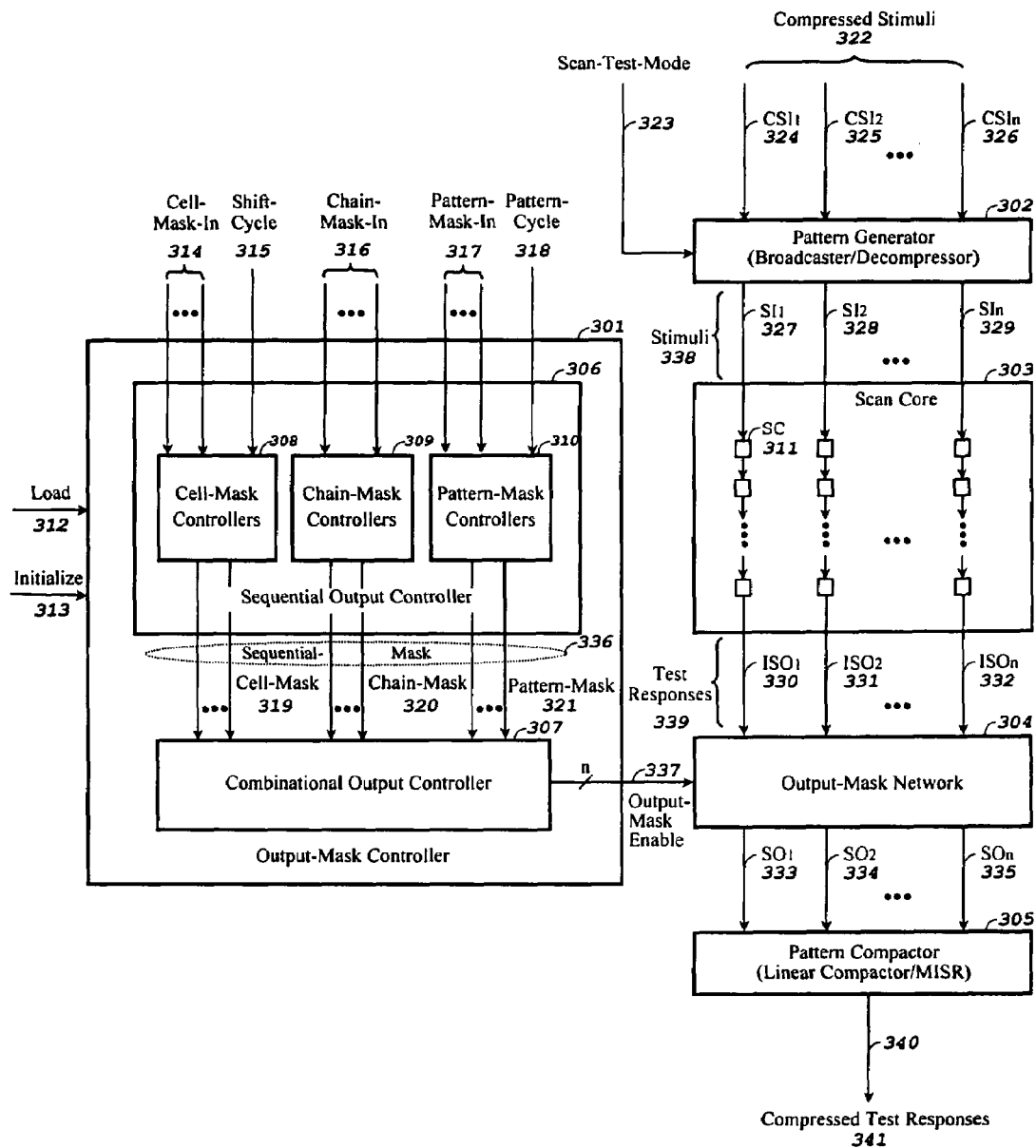
FIG. 3A shows a generic scheme for debug, diagnosis, and yield improvement of a scan-based integrated circuit using an output-mask controller and an output-mask network in scan-test mode, in accordance with the present invention.

FIG. 3A shows a generic scheme 300 for debug, diagnosis, and yield improvement of a scan-based integrated circuit using an output-mask controller and an output-mask network in scan-test mode, in accordance with the present invention. The output-mask network 304 is inserted between the scan core 303 and the pattern compactor 305. This output-mask network 304 is controlled by the output-mask controller 301, comprising a combinational output controller 307 and a sequential output controller 306. The sequential output controller 306 further comprises any combination of two or more cell-mask controllers 308, chain-mask controllers 309, and pattern-mask controllers 310. The output-mask controller 307 can further include an Initialize signal 313, which is used to either initialize the sequential output controller 306 or to bypass the combinational output controller 307, in order to pass all scan cells through the output-mask network 304 to the pattern compactor 305.

The cell-mask controllers 308 store the pass/mask information for scan cell locations across all scan chains. This information is programmed through the Cell-Mask-In inputs 314 when the Load signal 312 is asserted. In addition, the Shift-Cycle input 315 can be used to specify the scan cell location available at the scan outputs for compaction. Based on the preprogrammed cell-mask information, the cell-mask controllers 308 generate cell mask control signals on the Cell-Mask outputs 319.

The chain-mask controllers 309 store the pass/mask information for all scan chains. This information is programmed through the Chain-Mask-In inputs 316 when the Load signal 312 is asserted. Based on the preprogrammed chain-mask information, the chain-mask controllers 309 generate chain mask control signals on the Chain-Mask 320 outputs.

The pattern-mask controllers 310 store the pass/mask information for all scan patterns. This information is programmed through the Pattern-Mask-In inputs 317 when the Load signal 312 is asserted. In addition, the Pattern-Cycle input 318 can be used to specify the scan pattern currently being compacted. Based on the preprogrammed pattern-mask information, the pattern-mask controllers 310 generate pattern mask control signals on the Pattern-Mask outputs 321.

The Cell-Mask 319, Chain-Mask 320 and Pattern-Mask 321 outputs are collectively referred to as Sequential-Mask signals 336, which are used to control the combinational output controller 307.

The combinational output controller 307 is used to generate n output-mask enable signals Output-Mask Enable 337. The enable signals are used to control the output-mask network 304 to perform desired masking on output data streams coming from the scan core 303.

This masking scheme has the flexibility of implementing various mask functions. As a result, it will become easier to conduct debug, diagnosis, and yield improvement of a scan-based integrated circuit.

Note that the test mode is scan-test in the scheme shown FIG. 3A. That is, the stimuli 338 are generated from the Pattern Generator 302 by expanding externally provided compressed stimuli 322, which are either generated internally or supplied externally from an ATE (automatic test equipment). The Pattern Generator 302 can be a broadcaster or a decompressor. The test responses 339 are filtered by the output-mask network 304 and then processed by the Pattern Compactor 305 to form compressed test responses 341. The Pattern Compactor 305 can be a linear compactor or a MISR (Multi-Input Signature Register). The Scan-Test-Mode signal 323 is used to configure the integrated circuit such that the scan core 303 can be tested by Compressed Scan in scan-test mode.

Figure 3B:
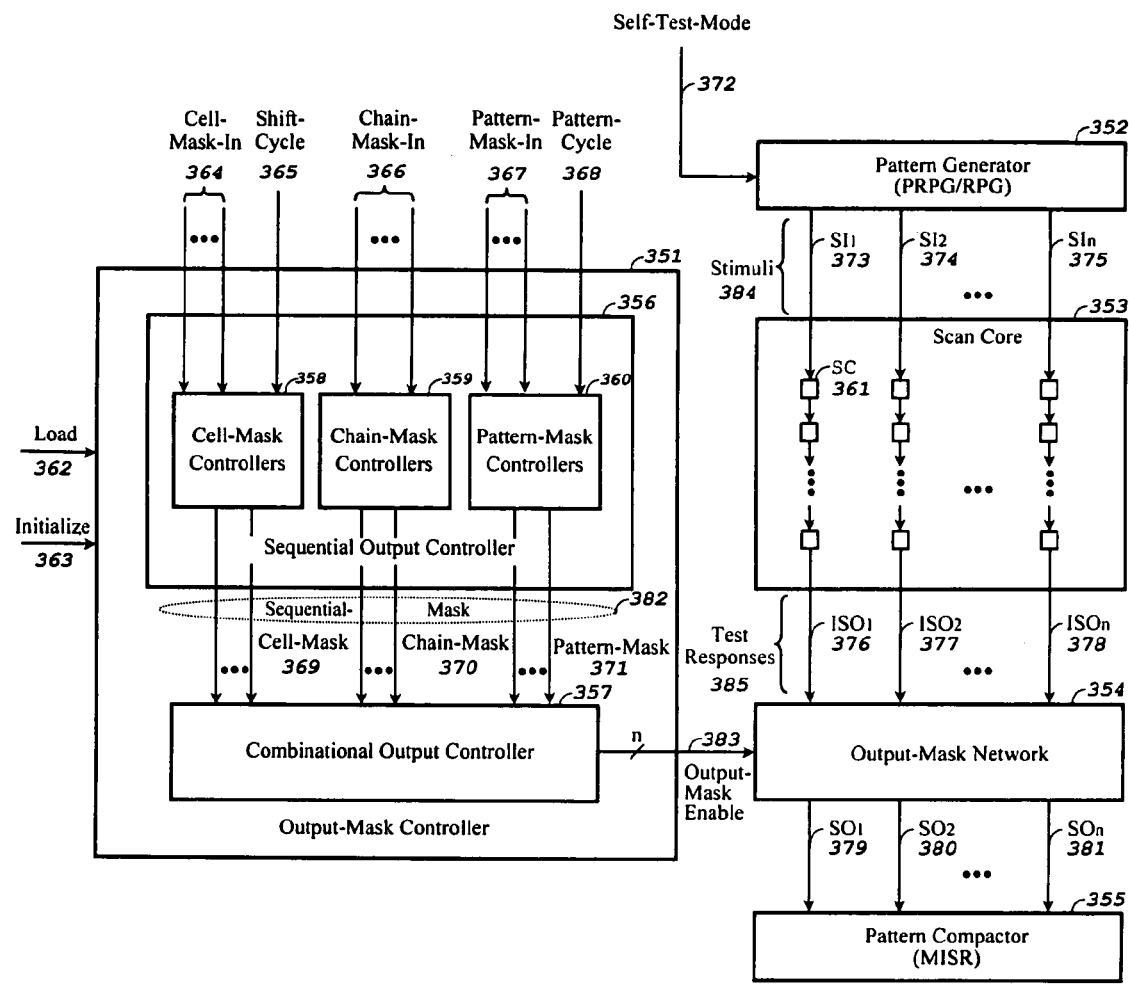
FIG. 3B shows a generic scheme for debug, diagnosis, and yield improvement of a scan-based integrated circuit using an output-mask controller and an output-mask network in self-test mode, in accordance with the present invention.

FIG. 3B shows a generic scheme 350 for debug, diagnosis, and yield improvement of a scan-based integrated circuit using an output-mask controller and an output-mask network in self-test mode, in accordance with the present invention. This scheme is similar to the one shown in FIG. 3A. The only difference is that the test mode is self-test as opposed to scan-test. The stimuli 384 are provided from the Pattern Generator 352, which is a PRPG (Pseudorandom Pattern Generator) or a RPG (Random Pattern Generator). The test responses 385 are filtered by the output-mask network 354 and compacted by the Pattern Compactor 355, which is a MISR (Multi-Input Signature Register). The Self-Test-Mode signal 372 is used to configure the integrated circuit such that the scan core 353 can be tested by Logic BIST in self-test mode.

Figure 4:
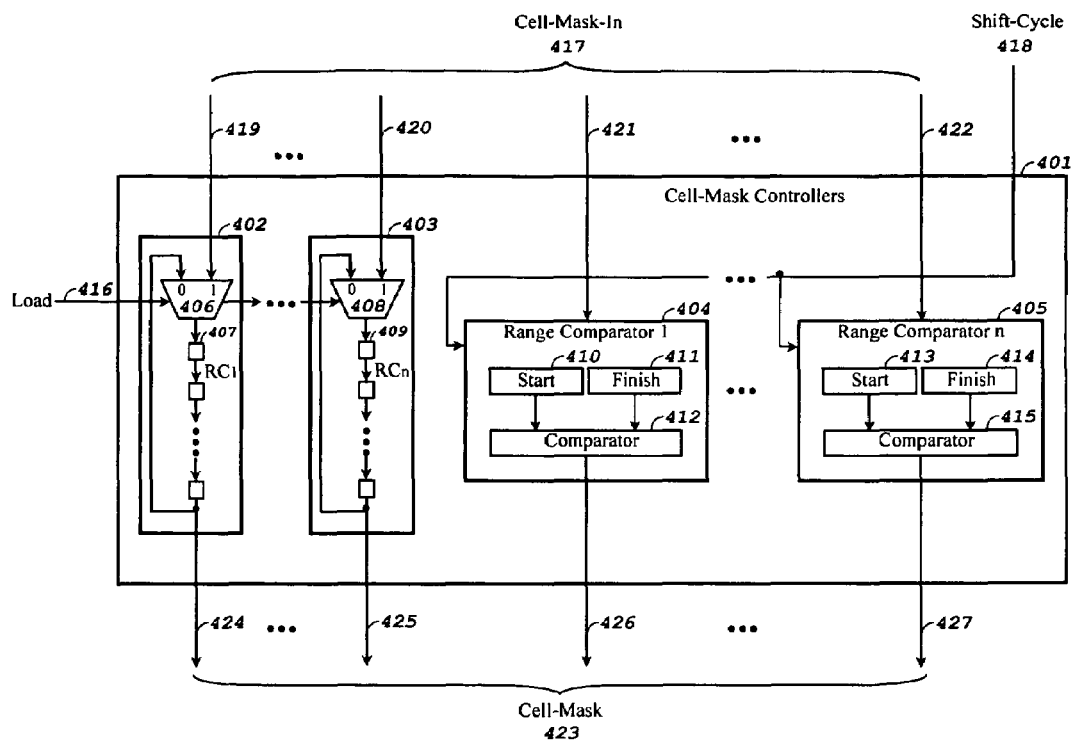
FIG. 4 shows an example of various types of cell-mask controllers, in accordance with the present invention.

FIG. 4 shows an example of various types of cell-mask controllers 401, in accordance with the present invention. The cell-mask controllers 401 consist of any number of ring counters RC1 402 to RCn 403 and range comparators Range Comparator 1 404 to Range Comparator n 405.

A ring counter, such as RC1 402, consists of a multiplexor 406 and a number of storage elements 407 connected as a shift register. The number of storage elements typically matches the number of scan cells in the longest scan chain in a scan core. The output 424 of the ring counter RC1 402 consists of the output of a storage element that is used to specify the cell-mask information for the scan cell location across all scan chains currently being compacted. Note that the output 424 of the ring counter RC1 402 is part of Cell-Mask signals 423. Depending on the value of the Load signal 416, the values of the storage elements in the ring counter RC1 402 can be either updated through the input 419 or rotated inside the ring counter. Note that the input 419 is part of the Cell-Mask-In inputs 417.

A range comparator, such as Range Comparator 1 404, consists of a start register 410, a finish register 411, and a comparator 412. The start register 410 is used to store the scan cell location across all scan chains from which scan cells should be masked off. The finish register 411 is used to store the scan cell location across all scan chains until which scan cells should be masked off. The current scan cell location being compacted is specified by the Shift-Cycle signal 418. The comparator 412 is used to determine if the current scan cell location falls between the specified start and finish locations. The comparison result is generated on the output 426, which is part of Cell-Mask signals 423. Note that the start and finish registers in Range Comparator 1 404 are programmed through the input 421, which is part of Cell-Mask-In signals 417.

Figure 5:
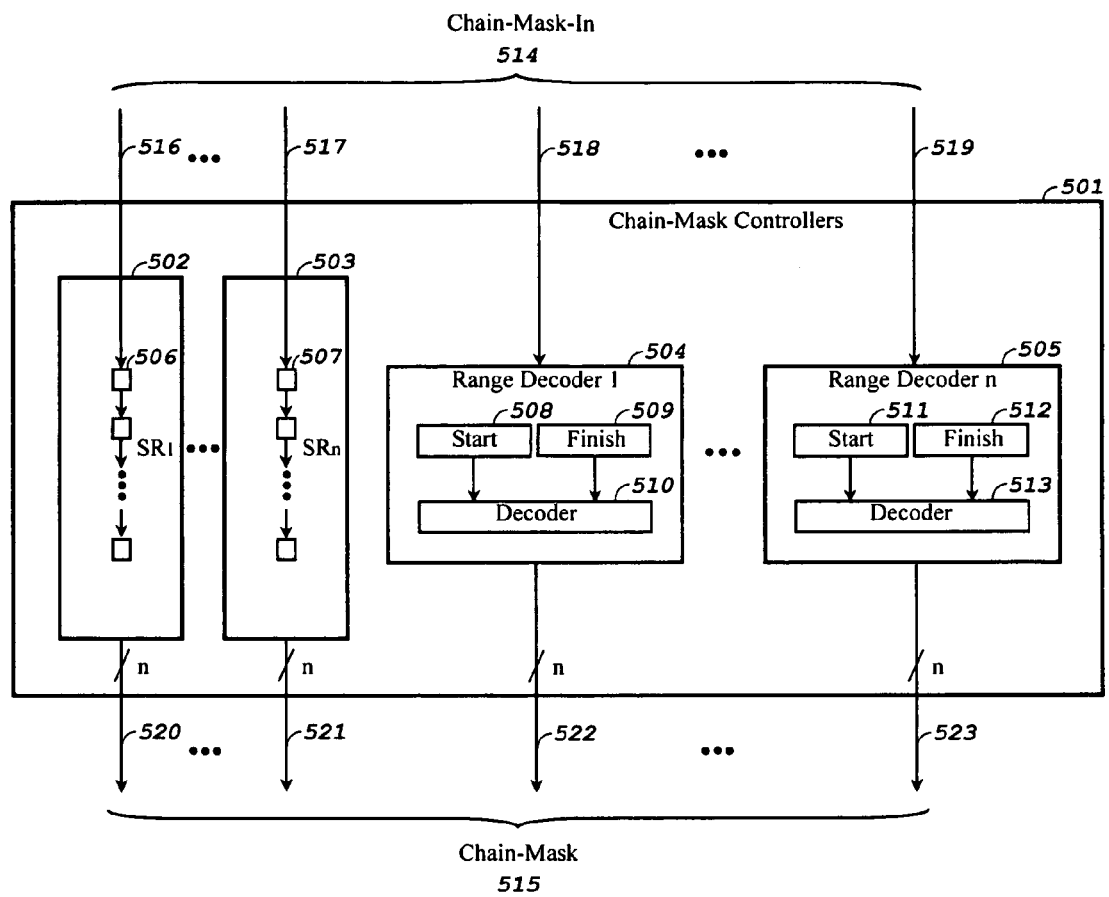
FIG. 5 shows an example of various types of chain-mask controllers, in accordance with the present invention.

FIG. 5 shows an example of various types of chain-mask controllers 501, in accordance with the present invention. The chain-mask controllers 501 consist of any number of shift registers SR1 502 to SRn 503 and range decoders Range Decoder 1 504 to Range Decoder n 505.

A shift register, such as SR1 502, consists of a number of storage elements 506. The number of storage elements typically matches the number of scan chains in a scan core. The output 520 of the shift register SR1 502 consists of the outputs of all storage elements in the shift register SR1 502. The information on the output 520 is used to specify the chain-mask information for all scan chains in parallel. Note that the output 520 is part of Chain-Mask signals 515. The values of the storage elements in the shift register SR1 502 can be updated through the input 516, which is part of Chain-Mask-In inputs 514.

A range decoder, such as Range Decoder 1 504, consists of a start register 508, a finish register 509, and a decoder 510. The start register 508 is used to store the scan chain number from which scan chains should be masked off. The finish register 509 is used to store the scan chain number until which scan chains should be masked off. The contents of the start register and the finish register are then decoded to generate the chain-mask information for all scan chains in parallel on the output 522, which is part of Chain-Mask signals 515. Note that the start register 508 and the finish register 509 are programmed through the input 518, which is part of Chain-Mask-In signals 514.

Figure 6:
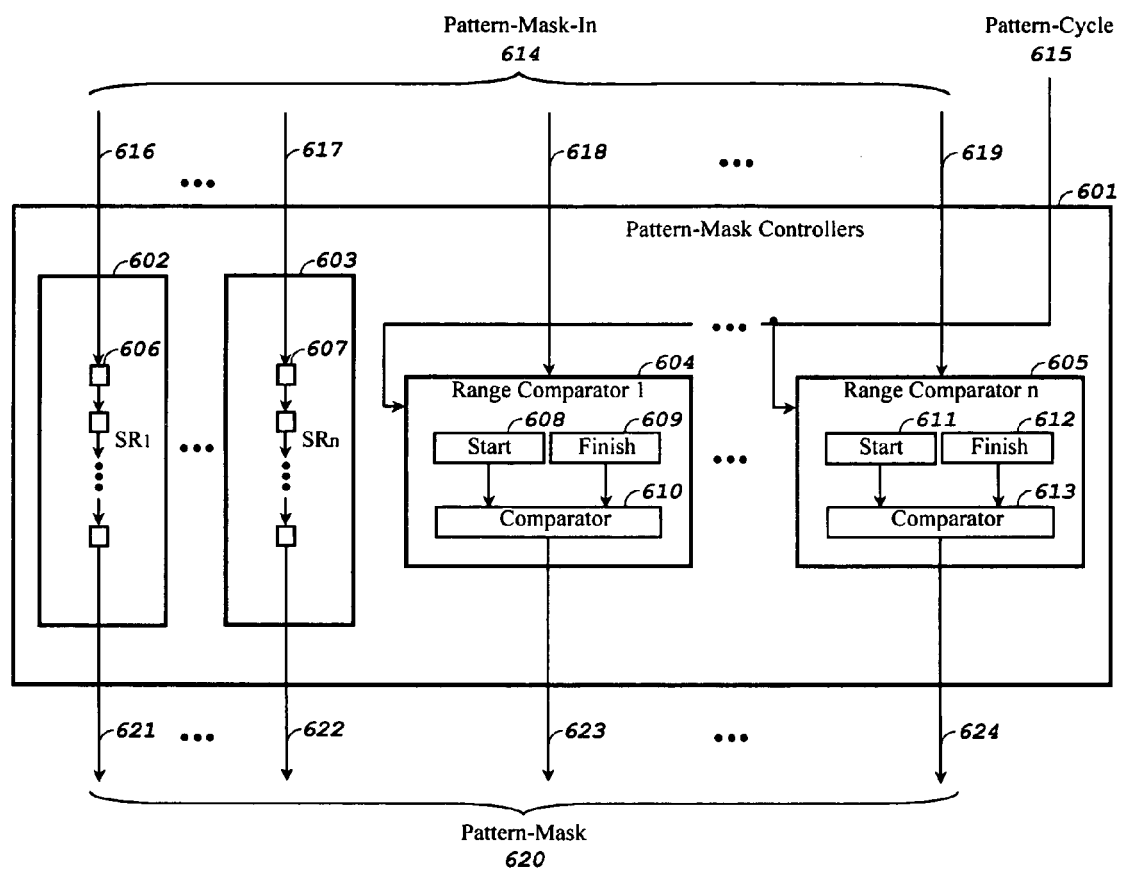
FIG. 6 shows an example of various types of pattern-mask controllers, in accordance with the present invention.

FIG. 6 shows an example of various types of pattern-mask controllers 601, in accordance with the present invention. The pattern-mask controllers 601 consist of any number of shift registers SR1 602 to SRn 603 and range comparators Range Comparator 1 604 to Range Comparator n 605.

A shift register, such as SR1 602, consists of a number of storage elements 606. The number of storage elements typically matches the number of scan patterns applied to a scan core. The output 621 of the shift register SR1 602 consists of the output of a storage element that is used to specify the pattern-mask information for the scan pattern currently being applied. Note that the output 621 is part of Pattern-Mask signals 620. The values of the storage elements in the shift register SR1 602 can be updated through the input 616, which is part of Pattern-Mask-In inputs 614.

A range comparator, such as Range Comparator 1 604, consists of a start register 608, a finish register 609, and a comparator 610. The start register 608 is used to store the scan pattern number from which scan patterns should be masked off. The finish register 609 is used to store the scan pattern number until which scan patterns should be masked off. The current scan pattern being applied is specified by the Pattern-Cycle signal 615. The comparator 610 is used to determine if the current scan pattern falls between the programmed scan pattern range. The comparison result is generated on the output 623, which is part of Pattern-Mask signals 620. Note that the start register 608 and the finish register 609 are programmed through the input 618, which is part of Pattern-Mask-In signals 614.

Figure 7A:
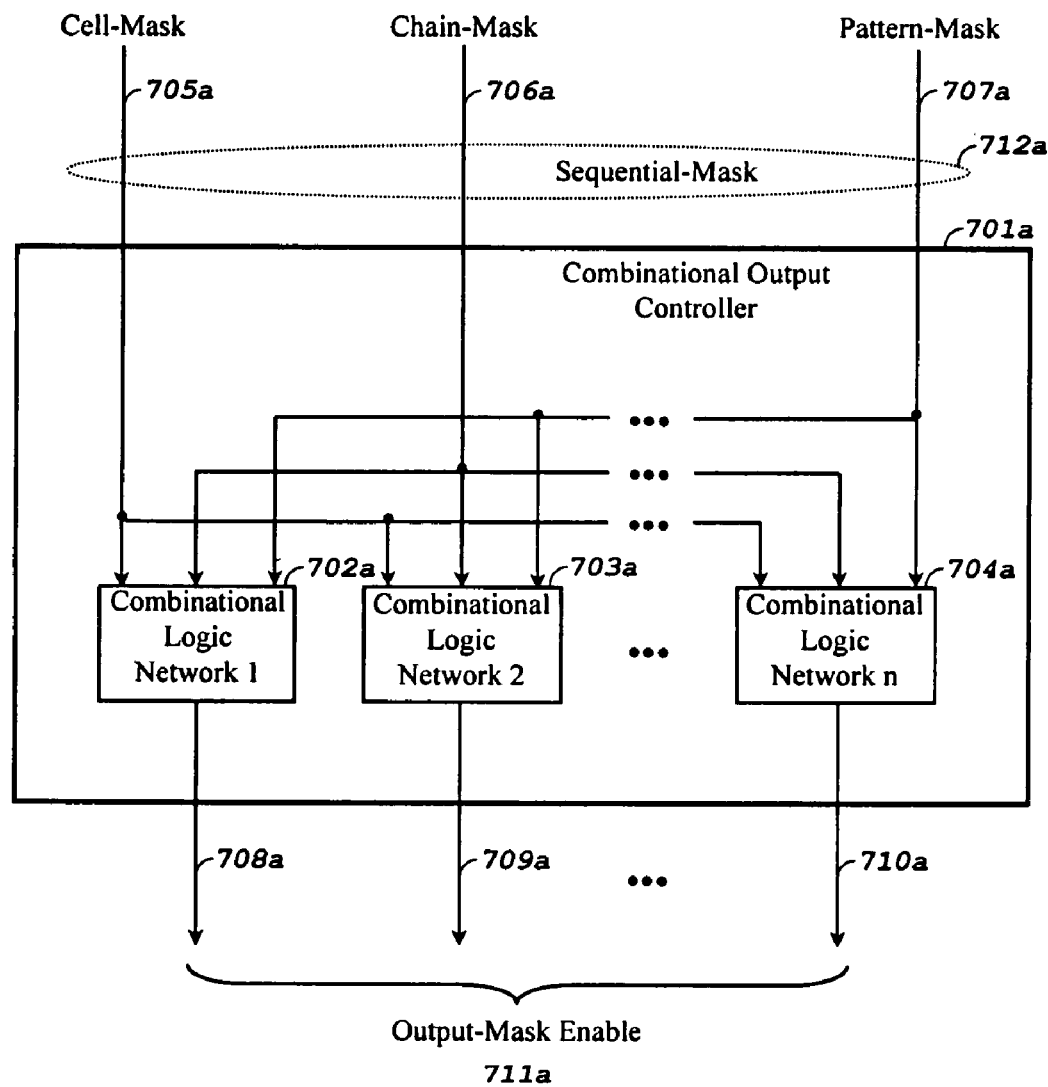
FIG. 7A shows a diagram of a generic combinational output controller, in accordance with the present invention.

FIG. 7A shows a diagram of a generic combinational output controller, in accordance with the present invention. The combinational output controller 701a consists of a number of combinational logic networks Combinational Logic Network 1 702a to Combinational Logic Network n 704a, each corresponding to one scan chain output from a scan core. Each combinational logic network accepts Sequential-Mask signals 712a as inputs and generates one output-mask enable signal as part of Output-Mask Enable signals 711a. The Output-Mask Enable signals 711a are used to control the output-mask network as shown in FIG. 3A and FIG. 3B.

Figure 7B:
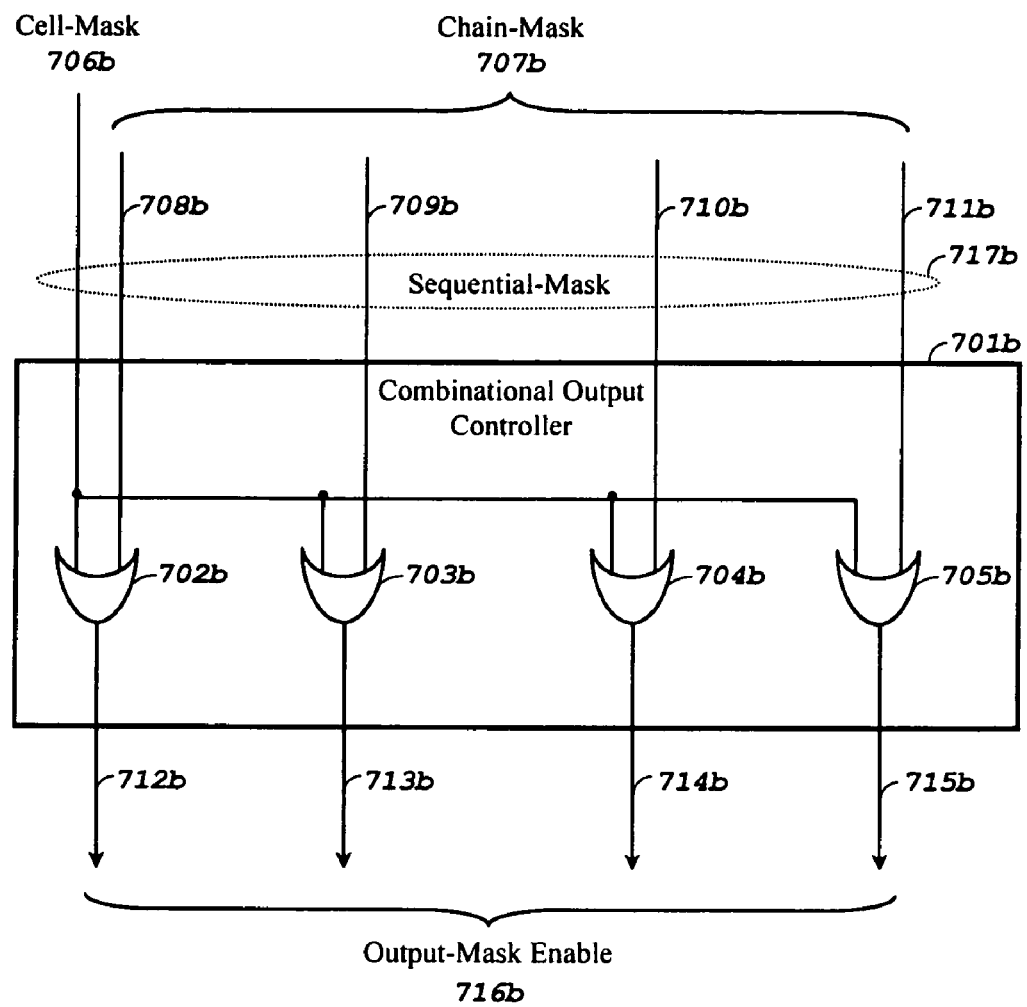
FIG. 7B shows a first embodiment of a combinational output controller shown in FIG. 7A, in accordance with the present invention.

FIG. 7B shows a first embodiment of a combinational output controller shown in FIG. 7A, in accordance with the present invention. The combinational output controller 701b consists of four combinational logic networks, each being an OR gate. Each OR gate takes inputs from the Sequential- Mask signals 717b. Assuming that setting an output-mask enable signal to logic value 0 corresponds to masking off a scan cell, this combinational output controller 701b can be used to mask off all scan cells in a scan chain, all scan chains for a single scan cell location. It can also mask off individual scan cell locations in individual scan chains.

Figure 7C:
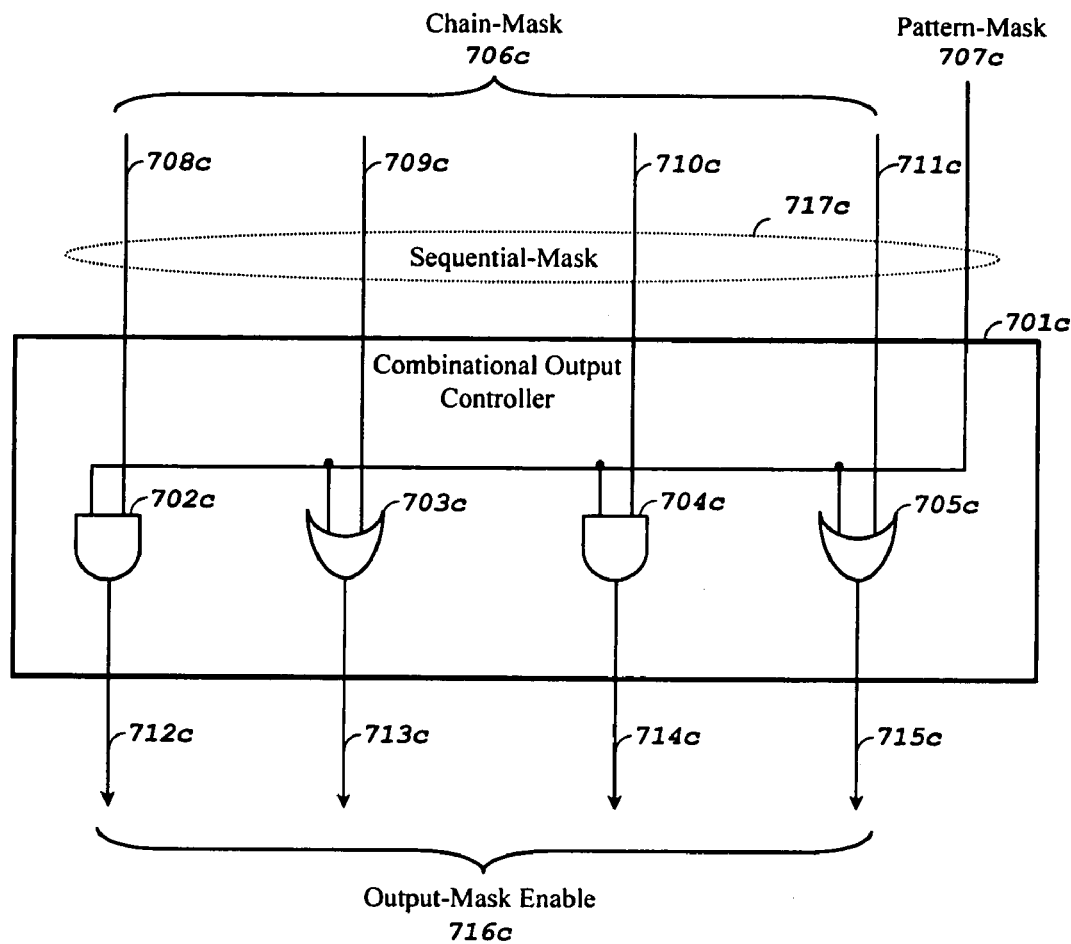
FIG. 7C shows a second embodiment of a combinational output controller shown in FIG. 7A, in accordance with the present invention.

FIG. 7C shows a second embodiment of a combinational output controller shown in FIG. 7A, in accordance with the present invention. This combinational output controller 701c consists of four combinational logic networks, each being either an OR gate or an AND gate. Each AND or OR gate takes inputs from the Sequential-Mask signals 717c. Assuming that setting an output-mask enable signal to logic value 0 corresponds to masking off a scan cell, this combinational output controller 701c can be used to mask off all scan cells in a scan chain for all scan patterns and all scan cells for a single scan pattern. In addition, by using the Output-Mask Enable signals 716c generated with OR gates, such as 713c and 715c, it is possible to mask off individual scan chains in individual scan patterns.

Figure 7D:
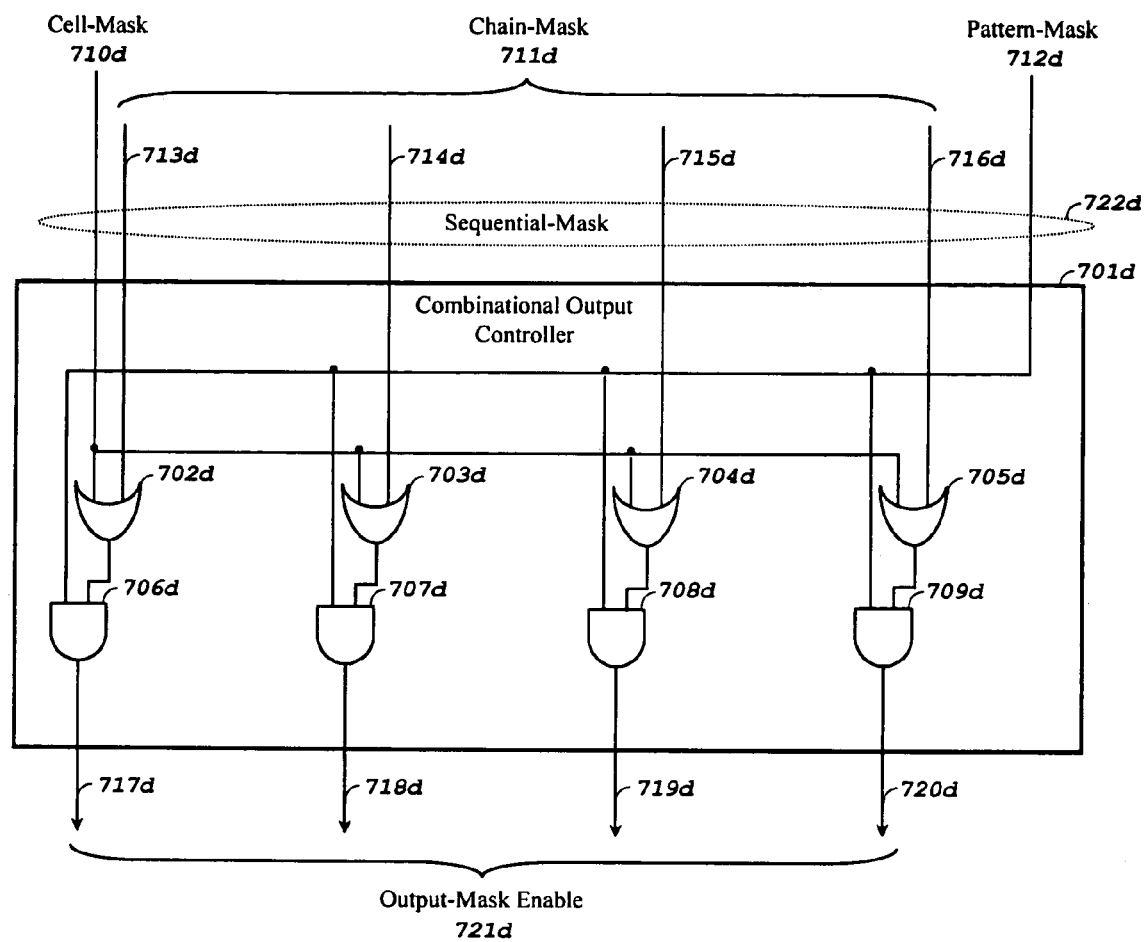
FIG. 7D shows a third embodiment of a combinational output controller shown in FIG. 7A, in accordance with the present invention.

FIG. 7D shows a third embodiment of a combinational output controller shown in FIG. 7A, in accordance with the present invention. This combinational output controller 701d consists of four combinational logic networks, each having an OR gate and an AND gate. Each OR gate has one Cell-Mask input 710d and one of Chain-Mask inputs 711d. Each AND gate has one Pattern-Mask input 712d and one OR gate output. Assuming that setting an output-mask enable signal to logic value 0 corresponds to masking off a scan cell, this combinational output controller 701d can be used to mask off all scan cells in a scan pattern, all scan cells in a scan chain and all scan chains for a single scan cell location. It can also mask off individual scan cell locations in individual scan chains.

Figure 8A:
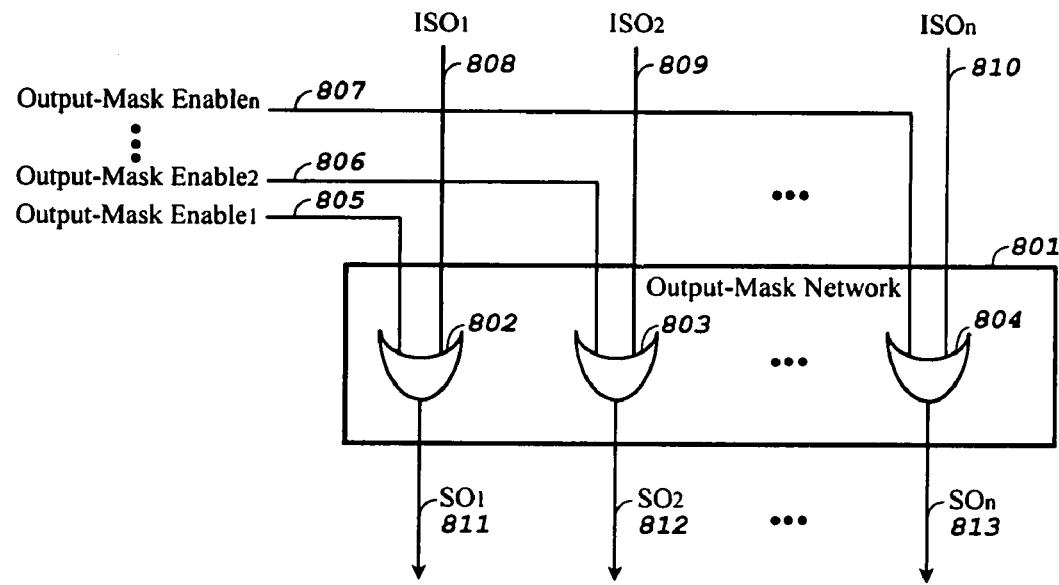
FIG. 8A shows a first embodiment of an output-mask network shown in FIG. 3A and FIG. 3B, in accordance with the present invention.

FIG. 8A shows a first embodiment of an output-mask network shown in FIG. 3A and FIG. 3B, in accordance with the present invention. The output-mask network 801 consists of a number of OR gates 802 to 804, one corresponding to each scan chain. Output-mask enable signals Output-Mask Enable 1 805 to Output-Mask Enable n 807 are ORed with internal scan chain outputs ISO1 808 to ISOn 810, respectively, and the outputs drive the scan chain outputs SO1 811 to SOn 813. The scan chain outputs SO1 811 to SOn 813 are used as inputs to the pattern compactors 305 and 355 shown in FIG. 3A and FIG. 3B, respectively. In this embodiment, a scan chain output is blocked, if its corresponding output-mask enable signal is set to logic value 1.

Figure 8B:
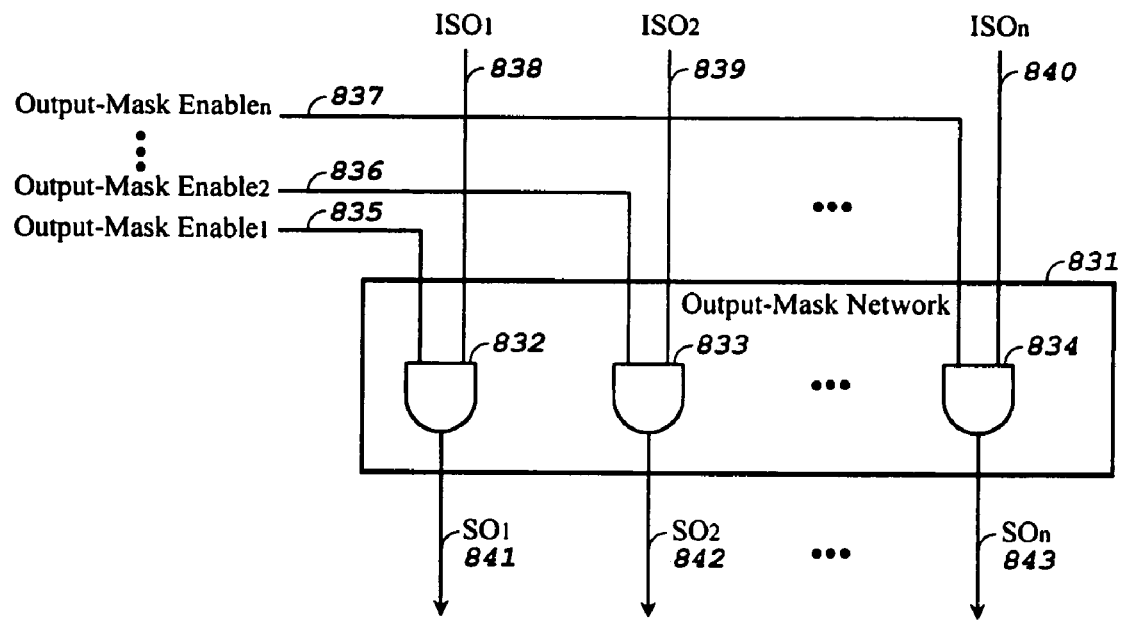
FIG. 8B shows a second embodiment of an output-mask network shown in FIG. 3A and FIG. 3B, in accordance with the present invention.

FIG. 8B shows a second embodiment of an output-mask network shown in FIG. 3A and FIG. 3B, in accordance with the present invention. The output-mask network 831 consists of a number of AND gates 832 to 834, one corresponding to each scan chain. Output-mask enable signals Output-Mask Enable 1 835 to Output-Mask Enable n 837 are ANDed with internal scan chain outputs ISO1 838 to ISOn 840, respectively, and the outputs drive the scan chain outputs SO1 841 to SOn 843. The scan chain outputs SO1 841 to SOn 843 are used as inputs to the pattern compactors 305 and 355 shown in FIG. 3A and FIG. 3B, respectively. In this embodiment, a scan chain output is blocked, if its corresponding output-mask enable signal is set to logic value 0.

Figure 8C:
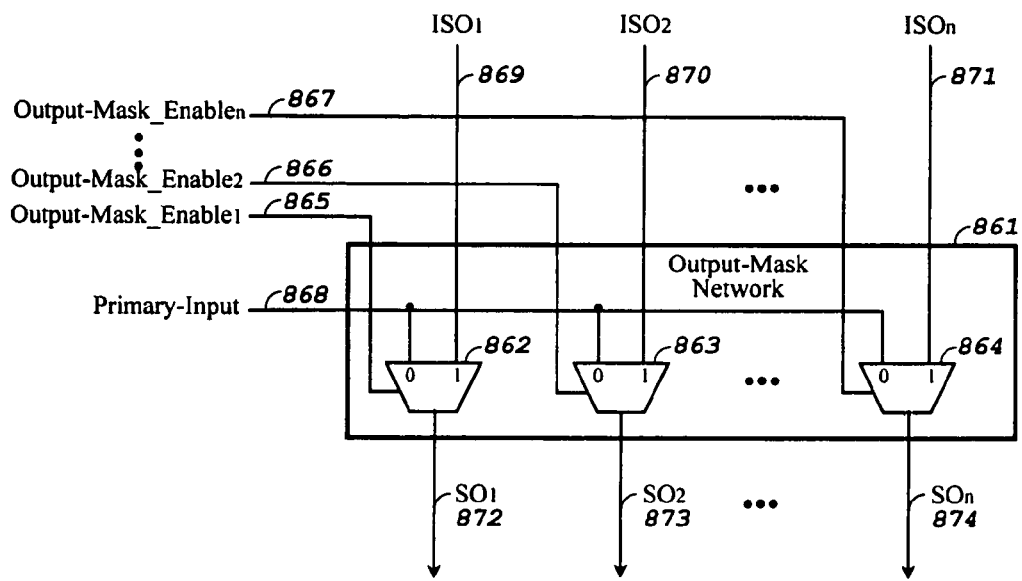
FIG. 8C shows a third embodiment of an output-mask network shown in FIG. 3A and FIG. 3B, in accordance with the present invention.

FIG. 8C shows a third embodiment of an output-mask network shown in FIG. 3A and FIG. 3B, in accordance with the present invention. This output-mask network 861 consists of a number of multiplexors 862 to 864, one corresponding to each scan chain. Output-mask enable signals Output-Mask Enable 1 865 to Output-Mask Enable n 867 are used to select either internal scan chain outputs ISO1 869 to ISOn 871 or the Primary-input signal 868 to drive the scan chain outputs SO1 872 to SOn 874, respectively. The scan chain outputs SO1 872 to SOn 874 are used as inputs to the pattern compactors 305 and 355 shown in FIG. 3A and FIG. 3B, respectively. In this embodiment, a scan chain output is blocked, if its corresponding output-mask enable signal is set to logic value 0.

Figure 9:
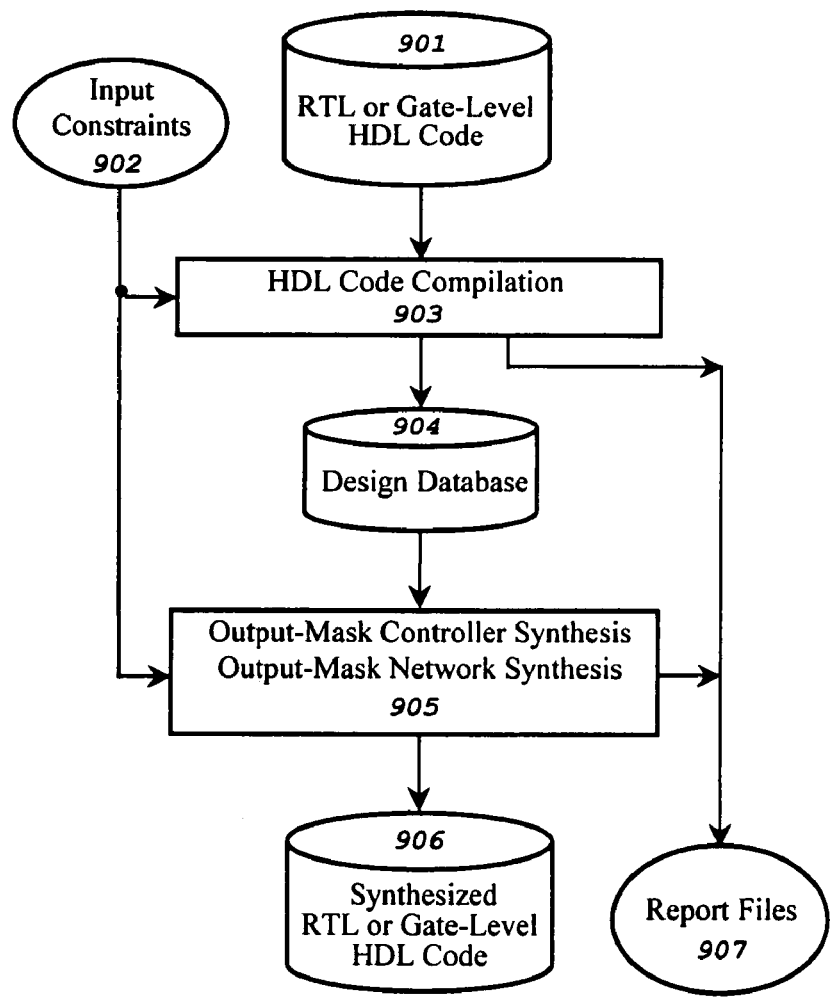
FIG. 9 shows a block diagram of a computer-aided design (CAD) system for synthesizing an output-mask controller and an output-mask network for debug, diagnosis, and yield improvement of a scan-based integrated circuit, in accordance with the present invention.

FIG. 9 shows a block diagram of a computer-aided design (CAD) system for synthesizing an output-mask controller and an output-mask network for debug, diagnosis, and yield improvement of a scan-based integrated circuit, in accordance with the present invention. The CAD system 900 accepts the user-supplied RTL (register-transfer level) or gate-level HDL (hardware description language) code 901, together with input constraints 902. The input constraints 902 contain all set-up information and scripts required for compiling 903 the HDL code 901 into an internal design database 904. Next, an output-mask controller and an output-mask network are synthesized 905 in accordance with the present invention. The process produces a synthesized RTL or gate-level HDL code 906. All reports and errors are stored in the report files 907.

Figure 10A:
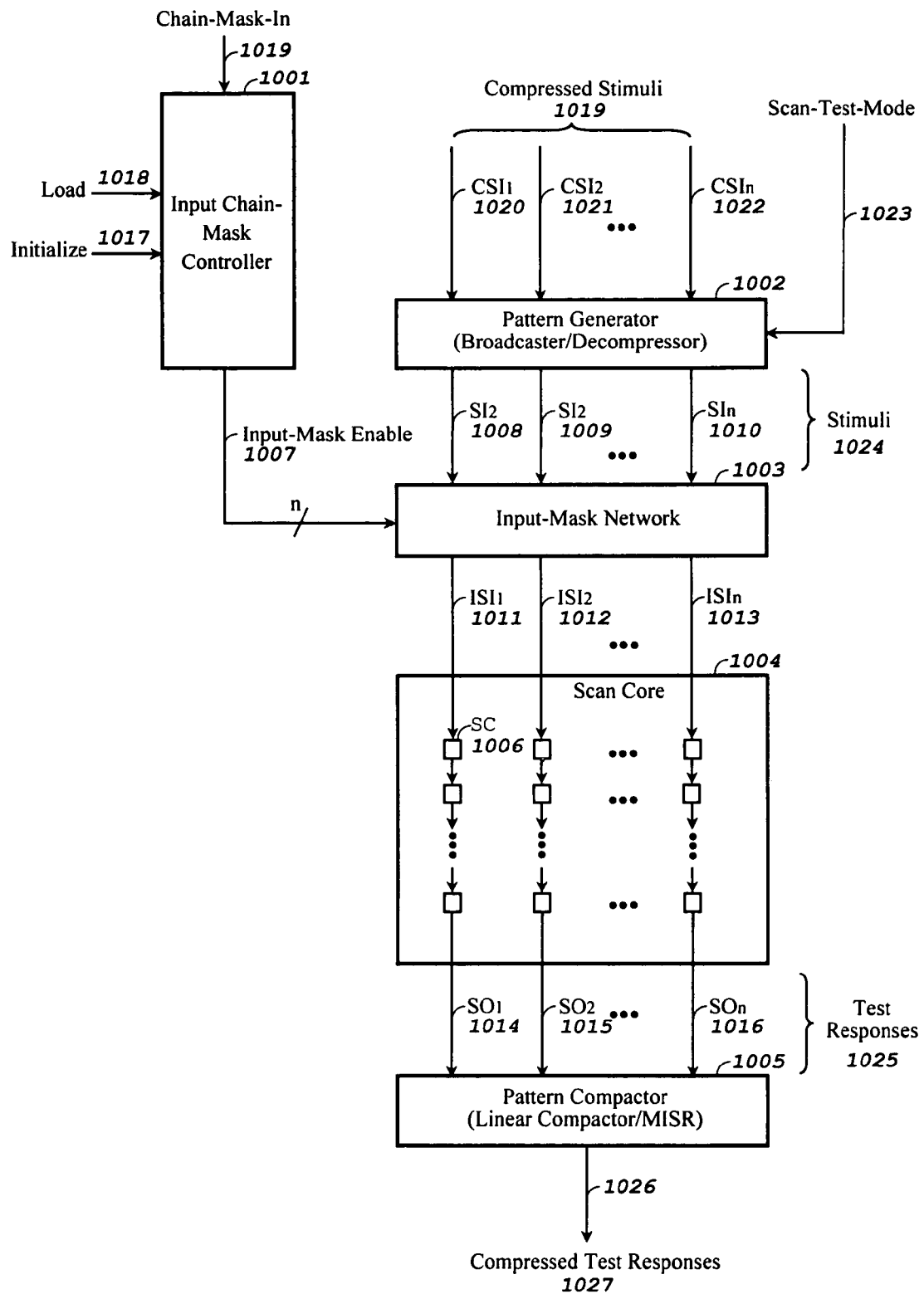
FIG. 10A shows a generic scheme for debug, diagnosis, and yield improvement of a scan-based integrated circuit using an input chain-mask controller and an input-mask network in scan-test mode, in accordance with the present invention.

FIG. 10A shows a generic scheme for debug, diagnosis, and yield improvement of a scan-based integrated circuit using an input chain-mask controller and an input-mask network in scan-test mode, in accordance with the present invention. In this scheme, the input mask network 1003 is controlled by an input chain-mask controller 1001. This scheme allows the designer to mask stimuli 1024 from entering the scan core 1004. The input chain-mask controller 1001 is used to generate n input-mask enable signals Input-Mask Enable 1007. The input chain-mask controller 1001 can include an Initialize signal 1017, which is used to either initialize or bypass the input chain-mask controller 1001, in order to pass all stimuli 1024 to the scan core 1004. The input chain-mask controller 1001 is programmed through the Chain-Mask-In input 1019 when the Load signal 1018 is asserted. The Scan-Test-Mode signal 1023 is used to configure the integrated circuit such that the scan core 1004 can be tested by Compressed Scan in scan-test mode.

Figure 10B:
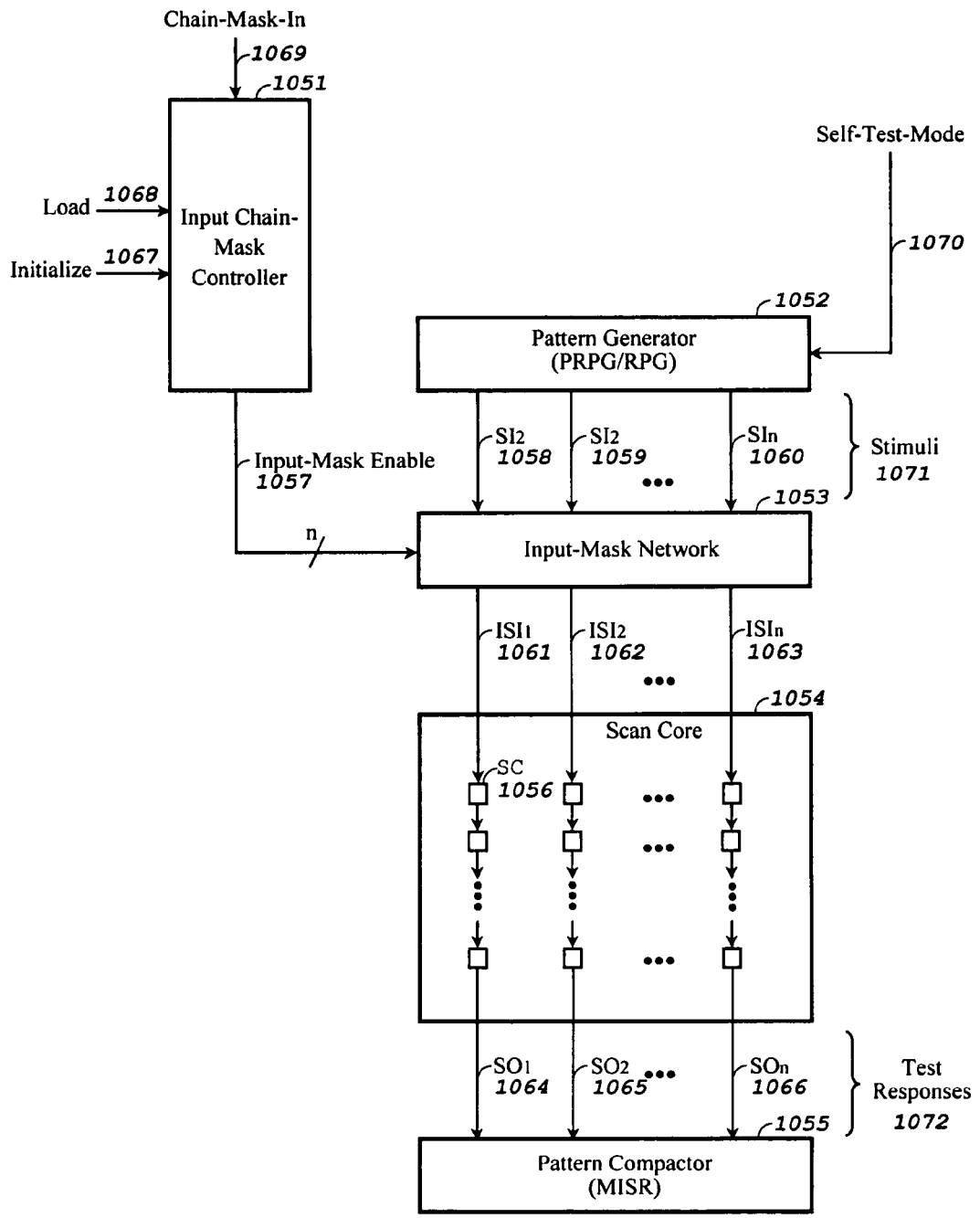
FIG. 10B shows a generic scheme for debug, diagnosis, and yield improvement of a scan-based integrated circuit using an input chain-mask controller and an input-mask network in self-test mode, in accordance with the present invention.

FIG. 10B shows a generic scheme for debug, diagnosis, and yield improvement of a scan-based integrated circuit using an input chain-mask controller and an input-mask network in self-test mode, in accordance with the present invention. In this scheme, the input mask network 1053 is controlled by an input chain-mask controller 1051. This scheme allows the designer to mask stimuli 1071 from entering the scan core 1054. The input chain-mask controller 1051 is used to generate n input-mask enable signals Input-Mask Enable 1057. The input chain-mask controller 1051 can include an Initialize signal 1067, which is used to either initialize or bypass the input chain-mask controller 1051, in order to pass all stimuli 1071 to the scan core 1054. The input chain-mask controller 1051 is programmed through the Chain-Mask-In input 1069 when the Load signal 1068 is asserted. The Self-Test-Mode signal 1070 is used to configure the integrated circuit such that the scan core 1054 can be tested by Logic BIST in self-test mode.

Figure 11A:
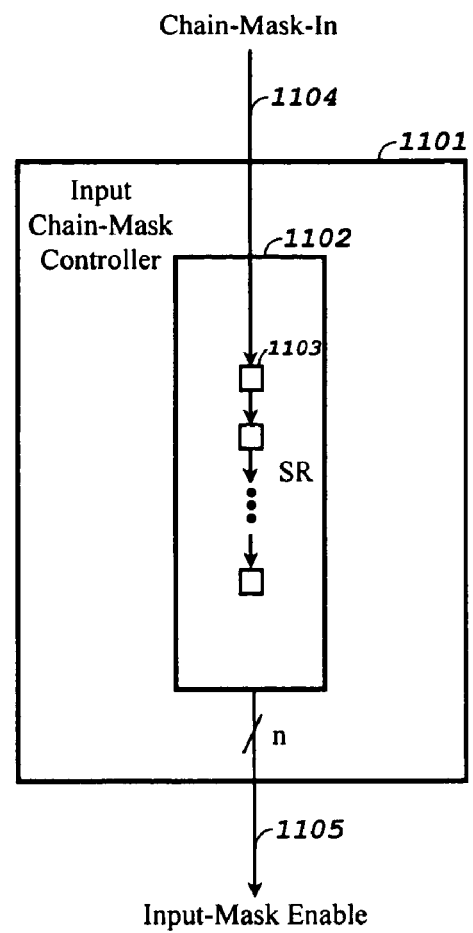
FIG. 11A shows a first embodiment of an input chain-mask controller shown in FIG. 10A and FIG. 10B, in accordance with the present invention.

FIG. 11A shows a first embodiment of an input chain-mask controller shown in FIG. 10A and FIG. 10B, in accordance with the present invention. The input chain-mask controller 1101 consists of a shift register SR 1102, comprising a number of storage elements 1103. The number of storage elements typically matches the number of scan chains in a scan core. The output of the shift register SR 1102, namely Input-Mask Enable 1105, consists of the outputs of all storage elements in the shift register and is used to specify the input-mask enable information for all scan chains in parallel. The values of the storage elements 1103 in the shift register SR 1102 can be updated through the Chain-Mask-In input 1104.

Figure 11B:
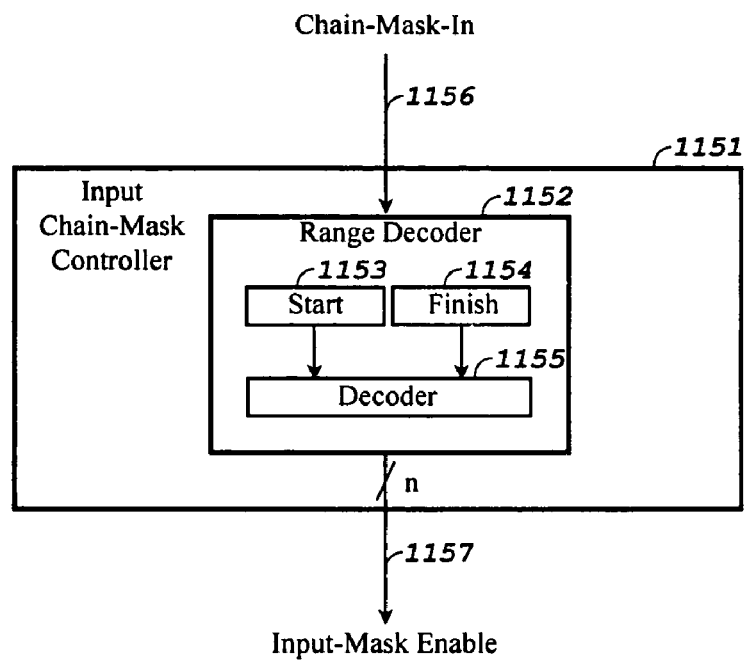
FIG. 11B shows a second embodiment of an input chain-mask controller shown in FIG. 10A and FIG. 10B, in accordance with the present invention.

FIG. 11B shows a second embodiment of an input chain-mask controller shown in FIG. 10A and FIG. 10B, in accordance with the present invention. The input chain-mask controller 1151 consists of a range decoder Range Decoder 1152, comprising a start register 1153, a finish register 1154, and a decoder 1155. The start register 1153 is used to store the scan chain number from which scan chains should be driven with a constant logic value. The finish register 1154 is used to store the scan chain number until which scan chains should be driven with a constant logic value. The contents of the start register 1153 and the finish register 1154 are decoded to generate the input-mask enable signals Input-Mask Enable signals 1157 for all scan chains in parallel. Note that the start register 1153 and the finish register 1154 are programmed through the Chain-Mask-In input 1156.

Figure 12A:
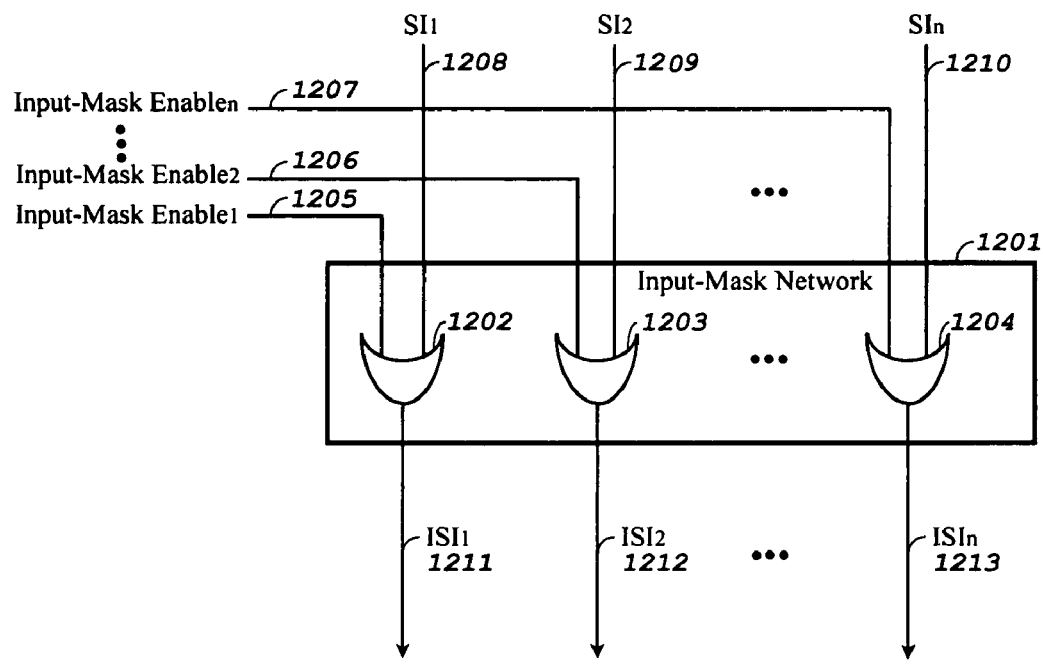
FIG. 12A shows a first embodiment of an input-mask network shown in FIG. 10A and FIG. 10B, in accordance with the present invention.

FIG. 12A shows a first embodiment of an input-mask network shown in FIG. 10A and FIG. 10B, in accordance with the present invention. The input-mask network 1201 consists of a number of OR gates 1202 to 1204, one for each scan chain input. Input-mask enable signals Input-Mask Enable 1 1205 to Input-Mask Enable n 1207 are ORed with scan chain inputs SI1 1208 to SIn 1210, respectively, and the outputs drive the internal scan chain inputs ISI1 1211 to ISIn 1213. In this embodiment, a scan chain input is blocked, if its corresponding input-mask enable signal is set to logic value 1.

Figure 12B:
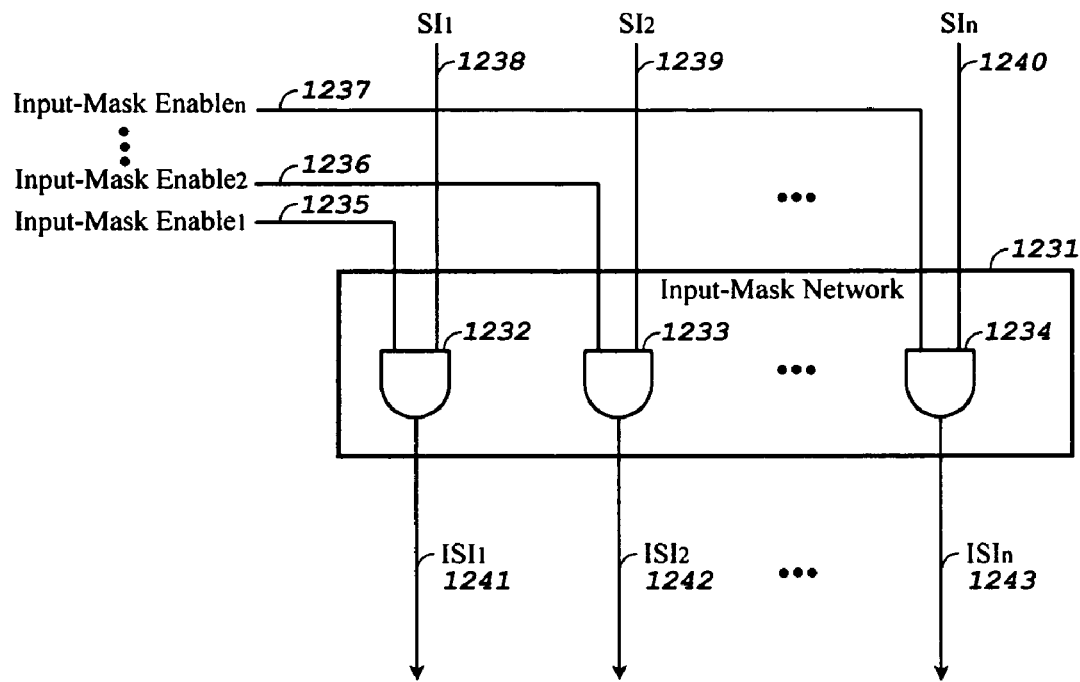
FIG. 12B shows a second embodiment of an input-mask network shown in FIG. 10A and FIG. 10B, in accordance with the present invention.

FIG. 12B shows a second embodiment of an input-mask network shown in FIG. 10A and FIG. 10B, in accordance with the present invention. The input-mask network 1231 consists of a number of AND gates 1232 to 1234, one for each scan chain input. Input-mask enable signals Input-Mask Enable 1 1235 to Input-Mask Enable n 1237 are ANDed with scan chain inputs SI1 1238 to Sin 1240, respectively, and the outputs drive the internal scan chain inputs ISI1 1241 to ISIn 1243. In this embodiment, a scan chain input is blocked, if its corresponding input-mask enable signal is set to logic value 0.

Figure 12C:
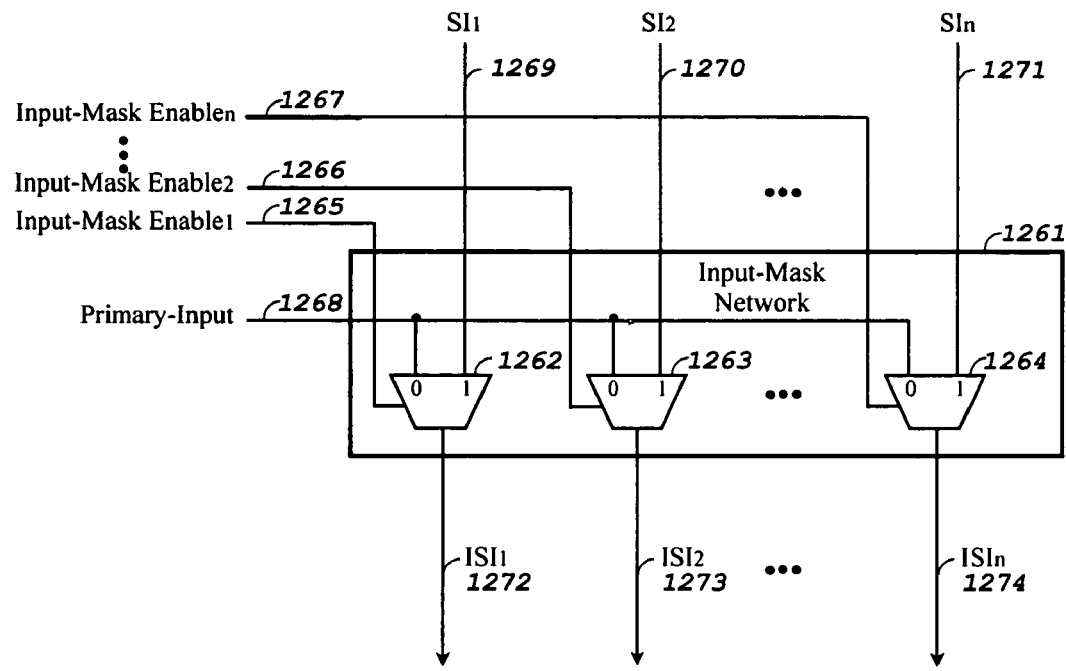
FIG. 12C shows a third embodiment of an input-mask network shown in FIG. 10A and FIG. 10B, in accordance with the present invention.

FIG. 12C shows a third embodiment of an input-mask network shown in FIG. 10A and FIG. 10B, in accordance with the present invention. The input-mask network 1261 consists of a number of multiplexors 1262 to 1264, one corresponding to each scan chain input. Input-mask enable signals Input-Mask Enable 1 1265 to Input-Mask Enable n 1267 are used to select either scan chain inputs SI1 1269 to SIn 1271 or the Primary-Input signal 1268 to drive the internal scan chain inputs ISI1 1272 to ISIn 1274, respectively. In this embodiment, a scan chain input is blocked if its corresponding input-mask enable signal is set to logic value 0.

Figure 13:
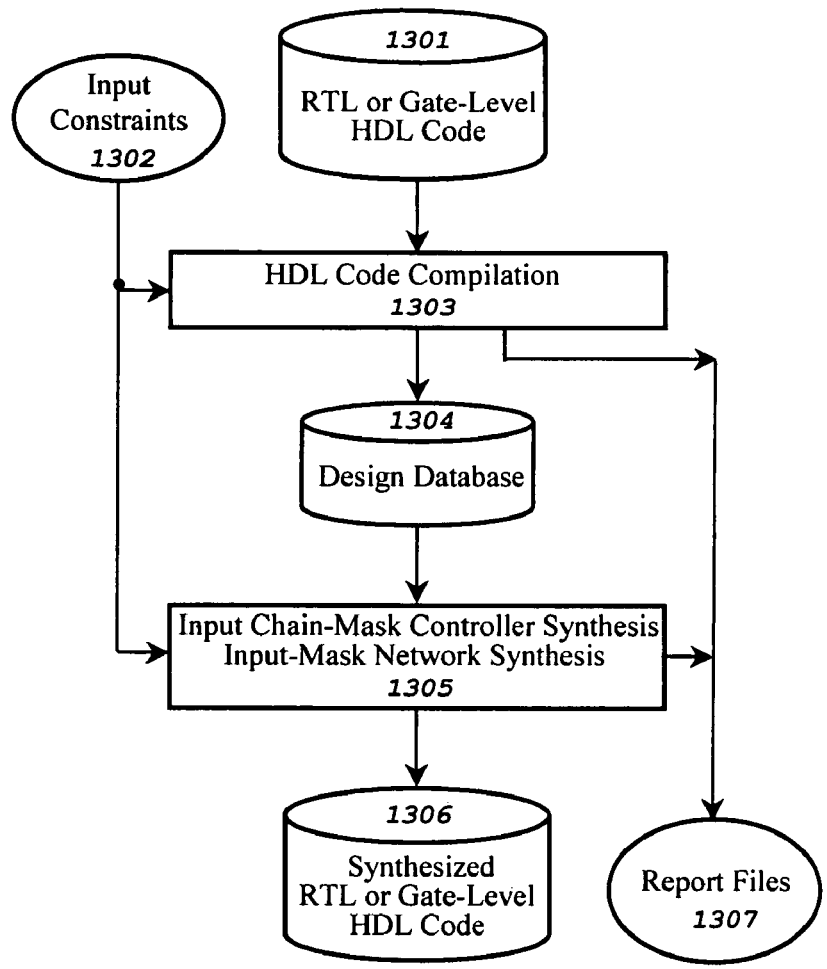
FIG. 13 shows a block diagram of a computer-aided design (CAD) system for synthesizing an input chain-mask controller and an input-mask network for debug, diagnosis, and yield improvement of a scan-based integrated circuit, in accordance with the present invention.

FIG. 13 shows a block diagram of a computer-aided design (CAD) system for synthesizing an input chain-mask controller and an input-mask network for debug, diagnosis, and yield improvement of a scan-based integrated circuit, in accordance with the present invention. The CAD system 1300 accepts the user-supplied RTL (register-transfer level) or gate-level HDL (hardware description language) code 1301, together with input constraints 1302. The input constraints 1302 contain all set-up information and scripts required for compiling 1303 the HDL code 1301 into an internal design database 1304. Next, an input chain-mask controller and an input-mask network are synthesized 1305 in accordance with the present invention. The process produces a synthesized RTL or gate-level HDL code 1306. All reports and errors are stored in the report files 1307.

FIG. 14A shows a flow diagram of the method for generating test patterns for a scan-based integrated circuit with an output-mask controller, an output-mask network, an input chain-mask controller, and an input-mask network in scan-test mode, in accordance with the present invention. The system 1400 accepts the user-supplied RTL (register-transfer level) or gate-level HDL (hardware design language) code 1401 representing a scan-based integrated circuit design with an output-mask controller, an output-mask network, an input chain-mask controller, and an input-mask network. In addition, input constraints 1402 and an optional foundry library 1403 are provided. The input constraints 1402 contain all set-up information and scripts required for compilation 1405, model transformation 1407, predetermined pattern fault simulation 1409, combinational ATPG (automatic test pattern generation) 1410, and post-processing 1411. The input constraints can further include a predetermined state of the output-mask controller and the input chain-mask controller used for predetermined pattern fault simulation 1409 and combinational ATPG 1410. The compilation step 1405 is to compile the HDL code 1401 into a sequential circuit model 1406. The model transformation step 1407 is to convert the sequential circuit model 1406 into an equivalent combinational circuit model 1408. The predetermined pattern fault simulation step 1409 is to identify the faults that are detected by a set of predetermined patterns. The combinational ATPG (automatic test pattern generation) step 1410 is to generate test patterns. Finally, the post-processing step 1411 is to generate HDL test benches and ATE (automatic test equipment) test programs 1412. All reports and errors are stored in the report files 1413.

FIG. 14B shows a flow diagram of the method for generating test patterns for a scan-based integrated circuit with an output-mask controller, an output-mask network, an input chain-mask controller, and an input-mask network in self-test mode, in accordance with the present invention. The system 1450 accepts the user-supplied RTL (register-transfer level) or gate-level HDL (hardware design language) code 1451 representing a scan-based integrated circuit design with an output-mask controller, an output-mask network, an input chain-mask controller, and an input-mask network. In addition, input constraints 1452 and an optional foundry library 1453 are provided. The input constraints 1452 contain all set-up information and scripts required for compilation 1455, model transformation 1457, pseudorandom pattern fault simulation 1459, and post-processing 1460. The input constraints can further include a predetermined state of the output-mask controller and the input chain-mask controller used for pseudorandom pattern fault simulation 1459. The compilation step 1455 is to compile the HDL code 1451 into a sequential circuit model 1456. The model transformation step 1457 is to convert the sequential circuit model 1456 into an equivalent combinational circuit model 1458. The pseudorandom pattern fault simulation step 1459 is to identify the faults that are detected by a set of pseudorandom patterns. Finally, the post-processing step 1460 is to generate HDL test benches and ATE (automatic test equipment) test programs 1461. All reports and errors are stored in the report files 1462.

FIG. 15 shows an electronic design automation system, where a computer-readable program, in accordance with the present invention, performs a method for synthesizing an output-mask controller, an output-mask network, an input chain-mask controller, and an input-mask network, as well as for generating test patterns in either scan-test or self-test mode. The system 1500 includes a processor 1502, which operates together with a memory 1501 to run a set of software for synthesizing an output-mask controller, an output-mask network, an input chain-mask controller, and an input-mask network, as well as for generating test patterns in either scan-test or self-test mode. The processor 1502 may represent a central processing unit of a personal computer, workstation, mainframe computer or other suitable digital processing device. The memory 1501 can be an electronic memory or a magnetic or optical disk-based memory, or various combinations thereof. A designer interacts with the software run by processor 1502 to provide appropriate inputs via an input device 1503, which may be a keyboard, disk drive or other suitable source of design information. The processor 1502 provides outputs to the designer via an output device 1504, which may be a display, a printer, a disk drive or various combinations of these and other elements.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for selectively masking off undesirable states in selected scan cells, which cause test failures, from being compacted in selected pattern compactors for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, an output-mask controller, and an output-mask network, each scan chain comprising multiple scan cells coupled in series, the output-mask controller including a combinational output controller connected to the output-mask network, the combinational output controller comprising one or more selected combinational logic networks other than a complete network of AND gates; said method comprising:
   (a) generating and shifting in a stimulus through said pattern generators to all said scan cells in said scan-based integrated circuit during a shift-in operation; said generating and shifting in a stimulus through said pattern generators to all said scan cells further comprises generating a compressed stimulus, decompressing said compressed stimulus as said stimulus through said pattern generators, and shifting in said stimulus to all said scan cells in said selected scan-test mode during said shift-in operation; wherein said compressed stimulus is selectively generated internally or supplied externally from an ATE (automatic test equipment);
   (b) capturing a test response to all said scan cells during a selected capture operation;
   (c) shifting out said test response or said stimulus to said pattern compactors for compaction by selectively masking off said undesirable states in said selected scan cells from being compacted in said selected pattern compactors using said output-mask controller and said output-mask network, while shifting in a new stimulus to all said scan cells, during a shift-out operation; and
   (d) repeating steps (b) to (c) until a predetermined limiting criteria is reached.

2. The method of claim 1, wherein each said pattern generator is selectively a broadcaster or a decompressor.

3. A method for selectively masking off undesirable states in selected scan cells, which cause test failures, from being compacted in selected pattern compactors for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, an output-mask controller, and an output-mask network, each scan chain comprising multiple scan cells coupled in series, the output-mask controller including a combinational output controller connected to the output-mask network, the combinational output controller comprising one or more selected combinational logic networks other than a complete network of AND gates; said method comprising:
   (a) generating and shifting in a stimulus through said pattern generators to all said scan cells in said scan-based integrated circuit during a shift-in operation; said generating and shifting in a stimulus through said pattern generators to all said scan cells further comprises using a load signal to preset said output-mask controller with a predetermined state for selectively masking off said undesirable states in said selected scan cells from being compacted in said selected pattern compactors during a selected shifting operation;
   (b) capturing a test response to all said scan cells during a selected capture operation;
   (c) shifting out said test response or said stimulus to said pattern compactors for compaction by selectively masking off said undesirable states in said selected scan cells from being compacted in said selected pattern compactors using said output-mask controller and said output-mask network, while shifting in a new stimulus to all said scan cells, during a shift-out operation; and
   (d) repeating steps (b) to (c) until a predetermined limiting criteria is reached.

4. A method for selectively masking off undesirable states in selected scan cells, which cause test failures, from being compacted in selected pattern compactors for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, an output-mask controller, and an output-mask network, each scan chain comprising multiple scan cells coupled in series, the output-mask controller including a combinational output controller connected to the output-mask network, the combinational output controller comprising one or more selected combinational logic networks other than a complete network of AND gates; said method comprising:
   (a) generating and shifting in a stimulus through said pattern generators to all said scan cells in said scan-based integrated circuit during a shift-in operation; said shifting out said test response or said stimulus to said pattern compactors for compaction further comprises using said output-mask controller to generate a plurality of output-mask enable signals for controlling said output-mask network for selectively mask off said undesirable states in said selected scan cells from being compacted in said selected pattern compactors during said shift-out operation; said output-mask controller further comprises a sequential output controller for generating a plurality of sequential-mask signals and said combinational output controller for generating said output-mask enable signals;

(b) capturing a test response to all said scan cells during a selected capture operation;

(c) shifting out said test response or said stimulus to said pattern compactors for compaction by selectively masking off said undesirable states in said selected scan cells from being compacted in said selected pattern compactors using said output-mask controller and said output-mask network, while shifting in a new stimulus to all said scan cells, during a shift-out operation; and (d) repeating steps (b) to (c) until a predetermined limiting criteria is reached.

5. The method of claim 4, wherein said sequential output controller in said output-mask controller further comprises a plurality of selected cell-mask controllers for generating one or more selected cell-mask signals, a plurality of selected chain-mask controllers for generating one or more selected chain-mask signals, and a plurality of selected pattern-mask controllers for generating one or more selected pattern-mask signals; wherein said selected cell-mask signals, said selected chain-mask signals, and said selected pattern-mask signals are collectively referred to as said sequential-mask signals.

6. The method of claim 5, wherein each said cell-mask controller in said sequential output controller is a first finite-state machine generating one or more said selected cell-mask signals.

7. The method of claim 6, wherein said first finite-state machine is selectively a ring counter (RC) or a first range comparator.

8. The method of claim 5, wherein each said chain-mask controller in said sequential output controller is a second finite-state machine generating one or more said selected chain-mask signals.

9. The method of claim 8, wherein said second finite-state machine is selectively a first shift register (SR) or a range decoder.

10. The method of claim 5, wherein each said pattern-mask controller in said sequential output controller is a third finite-state machine generating one or more said selected pattern-mask signals.

11. The method of claim 10, wherein said third finite-state machine is selectively a second shift register (SR) or a second range comparator.

12. The method of claim 4, wherein said combinational output controller, comprising one or more said selected combinational logic networks other than said complete network of AND gates, further accepts said sequential-mask signals as inputs for generating said output-mask enable signals for controlling said output-mask network for selectively masking off all said undesirable states in said selected scan cells from being compacted in said selected pattern compactors during said shift-out operation.

13. The method of claim 12, wherein each said selected combinational logic network further comprises one or more first selected combinational gates; wherein each said first selected combinational gate is selectively an AND gate, OR gate, NAND gate, NOR gate, Exclusive-OR (XOR) gate, Exclusive-NOR (XNOR) gate, multiplexor (MUX), or inverter (INV).

14. A method for selectively masking off undesirable states in selected scan cells, which cause test failures, from being compacted in selected pattern compactors for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, an output-mask controller, and an output-mask network, each scan chain comprising multiple scan cells coupled in series, the output-mask controller including a combinational output controller connected to the output-mask network, the combinational output controller comprising one or more selected combinational logic networks other than a complete network of AND gates; said method comprising:

(a) generating and shifting in a stimulus through said pattern generators to all said scan cells in said scan-based integrated circuit during a shift-in operation; each said pattern compactor is selectively a multi-input signature register (MISR) or a linear compactor; wherein said linear compactor further includes one or more third selected combinational gates; wherein each said third selected combinational gate is selectively an Exclusive-OR (XOR) gate or Exclusive-NOR (XNOR) gate;

(b) capturing a test response to all said scan cells during a selected capture operation;

(c) shifting out said test response or said stimulus to said pattern compactors for compaction by selectively masking off said undesirable states in said selected scan cells from being compacted in said selected pattern compactors using said output-mask controller and said output-mask network, while shifting in a new stimulus to all said scan cells, during a shift-out operation; and (d) repeating steps (b) to (c) until a predetermined limiting criteria is reached.

15. An output-mask controller for generating a plurality of output-mask enable signals for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, and an output-mask network, each scan chain comprising multiple scan cells coupled in series; said output-mask controller comprising:

(a) a sequential output controller for generating a plurality of sequential-mask signals; wherein said sequential output controller further comprises a plurality of selected cell-mask controllers for generating one or more selected cell-mask signals, a plurality of selected chain-mask controllers for generating one or more selected chain-mask signals, and a plurality of selected pattern-mask controllers for generating one or more selected pattern-mask signals; wherein said selected cell-mask signals, said selected chain-mask signals, and said selected pattern-mask signals are collectively referred to as said sequential-mask signals; and (b) a combinational output controller, comprising one or more selected combinational logic networks other than a complete network of AND gates, for generating a plurality of output-mask enable signals for controlling said output-mask network for selectively masking off undesirable states in selected scan cells, which cause test failure, from being compacted in selected pattern compactors.

16. The output-mask controller of claim 15, wherein each said cell-mask controller in said sequential output controller is a first finite-state machine generating one or more said selected cell-mask signals.

17. The output-mask controller of claim 16, wherein said first finite-state machine is selectively a ring counter (RC) or a first range comparator.

18. The output-mask controller of claim 15, wherein each said chain-mask controller in said sequential output controller is a second finite-state machine generating one or more selected chain-mask signals.

19. The output-mask controller of claim 18, wherein said second finite-state machine is selectively a first shift register (SR) or a range decoder.

20. The output-mask controller of claim 15, wherein each said pattern-mask controller in said sequential output controller is a third finite-state machine generating one or more said selected pattern-mask signals.

21. The output-mask controller of claim 20, wherein said third finite-state machine is second shift register (SR) or a second range comparator.

22. An output-mask controller for generating a plurality of output-mask enable signals for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, and an output-mask network, each scan chain comprising multiple scan cells coupled in series; said output-mask controller comprising:
  (a) a sequential output controller for generating a plurality of sequential-mask signals; wherein said combinational output controller, comprising one or more said selected combinational logic networks other than said complete network of AND gates, further accepts said sequential-mask signals as inputs for generating said output-mask enable signals for controlling said output-mask network for selectively masking off said undesirable states in said selected scan cells from being compacted in said selected pattern compactors; and
  (b) a combinational output controller, comprising one or more selected combinational logic networks other than a complete network of AND gates, for generating a plurality of output-mask enable signals for controlling said output-mask network for selectively masking off undesirable states in selected scan cells, which cause test failure, from being compacted in selected pattern compactors.

23. The output-mask controller of claim 22, wherein each said selected combinational logic network further comprises one or more first selected combinational gates; wherein each said first selected combinational gate is selectively an AND gate, OR gate, NAND gate, NOR gate, Exclusive-OR (XOR) gate, Exclusive-NOR (XNOR) gate, multiplexor (MUX), or inverter (INV).

24. A method for selectively driving selected constant logic values into all scan cells in selected scan chains for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, an input chain-mask controller, and an input-mask network, each scan chain comprising multiple scan cells coupled in series, the input chain-mask controller connected to the input-mask network; said method comprising:
  (a) generating and shifting in a stimulus through said pattern generators to all said scan cells in said scan-based integrated circuit by selectively forcing said selected constant logic values into all said scan cells in said selected scan chains during a shift-in operation; said generating and shifting in a stimulus through said pattern generators to all said scan cells further comprises generating a compressed stimulus, decompressing said compressed stimulus as said stimulus through said pattern generators, and shifting in said stimulus to all said scan cells in said selected scan-test mode during said shift-in operation; wherein said compressed stimulus is selectively generated internally or supplied externally from an ATE (automatic test equipment);
  (b) capturing a test response to all said scan cells during a selected capture operation;
  (c) shifting out said test response or said stimulus to said pattern compactors for compaction, while shifting in a new stimulus to all said scan cells in said scan-based integrated circuit, during a shift-out operation; and
  (d) repeating steps (b) to (c) until a predetermined limiting criteria is reached.

25. The method of claim 24, wherein each said pattern generator is selectively a broadcaster or a decompressor.

26. A method for selectively driving selected constant logic values into all scan cells in selected scan chains for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, an input chain-mask controller, and an input-mask network, each scan chain comprising multiple scan cells coupled in series, the input chain-mask controller connected to the input-mask network; said method comprising:
  (a) generating and shifting in a stimulus through said pattern generators to all said scan cells in said scan-based integrated circuit by selectively forcing said selected constant logic values into all said scan cells in said selected scan chains during a shift-in operation; wherein said generating and shifting in a stimulus through said pattern generators to all said scan cells further comprises automatically generating said stimulus internally using said pattern generators in said selected self-test mode during said shift-in operation; wherein each said pattern generator is selectively a pseudorandom pattern generator (PRPG) or a random pattern generator (RPG);
  (b) capturing a test response to all said scan cells during a selected capture operation;
  (c) shifting out said test response or said stimulus to said pattern compactors for compaction, while shifting in a new stimulus to all said scan cells in said scan-based integrated circuit, during a shift-out operation; and
  (d) repeating steps (b) to (c) until a predetermined limiting criteria is reached.

27. The method of claim 26, wherein said generating and shifting in a stimulus through said pattern generators to all said scan cells further comprises using a load signal to preset said input chain-mask controller with a predetermined state to selectively force said selected constant logic values into all said scan cells in said selected scan chains during a selected shift-in operation.

28. The method of claim 26, wherein said generating and shifting in a stimulus through said pattern generators to all said scan cells further comprises using said input chain-mask controller to generate a plurality of input-mask enable signals for controlling said input-mask network to selectively force said selected constant logic values into all said scan cells in said selected scan chains during said shift-in operation.

29. The method of claim 28, wherein said input chain-mask controller further comprises using an initialize signal to prevent said input-mask enable signals from forcing said selected constant logic values into all said scan cells in said selected scan chains.

30. The method of claim 28, wherein said input chain-mask controller is a finite-state machine generating said input-mask enable signals.

31. The method of claim 30, wherein said finite-state machine is selectively a shift register (SR) or a range decoder.

32. A method for selectively driving selected constant logic values into all scan cells in selected scan chains for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, an input chain-mask controller, and an input-mask network, each scan chain comprising multiple scan cells coupled in series, the input chain-mask controller connected to the input-mask network; said method comprising:
  (a) generating and shifting in a stimulus through said pattern generators to all said scan cells in said scan-based integrated circuit by selectively forcing said selected constant logic values into all said scan cells in said selected scan chains during a shift-in operation; wherein each said pattern compactor is selectively a multi-input signature register (MISR) or a linear compactor; wherein said linear compactor further includes one or more second selected combinational gates; wherein each said second selected combinational gate is selectively an Exclusive-OR (XOR) gate or Exclusive-NOR (XNOR) gate;
  (b) capturing a test response to all said scan cells during a selected capture operation;
  (c) shifting out said test response or said stimulus to said pattern compactors for compaction, while shifting in a new stimulus to all said scan cells in said scan-based integrated circuit, during a shift-out operation; and
  (d) repeating steps (b) to (c) until a predetermined limiting criteria is reached.

33. An input chain-mask controller for generating a plurality of input-mask enable signals for debug, diagnosis, and/or yield improvement of a scan-based integrated circuit in a selected scan-test mode or selected self-test mode, the scan-based integrated circuit containing a plurality of scan chains, a plurality of pattern generators, a plurality of pattern compactors, and an input-mask network, each scan chain comprising multiple scan cells coupled in series; said input chain-mask controller comprising:
  a finite-state machine for generating said input-mask enable signals for controlling said input-mask network to selectively force selected constant logic values into all scan cells in selected scan chains, and wherein said finite-state machine further comprises using a load signal to preset said input chain-mask controller with a predetermined state to selectively force said selected constant logic values into all said scan cells in said selected scan chains.

34. An input chain-mask controller for generating a plurality of input-mask enable signals for debug, diagnosis, and/or yield improvement of a scanbased integrated circuit in a selected scan-test mode or selected self-test mode, the scan-based integrated circuit containing a plurality of scan chains, a plurality of pattern generators, a plurality of pattern compactors, and an input-mask network, each scan chain comprising multiple scan cells coupled in series; said input chain-mask controller comprising:
  a finite-state machine for generating said input-mask enable signals for controlling said input-mask network to selectively force selected constant logic values into all scan cells in selected scan chains; and wherein said finite-state machine is selectively a shift register (SR) or a range decoder.

* * * * *